(12) United States Patent
Li et al.

(10) Patent No.: US 10,778,194 B2
(45) Date of Patent: Sep. 15, 2020

(54) AUTOMATIC COMPOSITION OF UNIVERSAL FILTERS

(71) Applicant: University of Florida Research Foundation, Inc., Gainesville, FL (US)

(72) Inventors: Kan Li, Gainesville, FL (US); Jose C. Principe, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 31 days.

(21) Appl. No.: 16/114,475

(22) Filed: Aug. 28, 2018

(65) Prior Publication Data

US 2019/0068171 A1    Feb. 28, 2019

Related U.S. Application Data

(60) Provisional application No. 62/550,751, filed on Aug. 28, 2017.

(51) Int. Cl.
*H03H 21/00*   (2006.01)
*G06N 20/00*   (2019.01)

(52) U.S. Cl.
CPC ......... *H03H 21/0043* (2013.01); *G06N 20/00* (2019.01); *H03H 2021/007* (2013.01); *H03H 2021/0061* (2013.01)

(58) Field of Classification Search
CPC ......... H03H 21/0043; H03H 2021/007; H03H 2021/006; H03H 2021/0049; H03H 2021/0054; G06N 20/00; G06N 20/10; G06N 3/02; G06N 3/04; G06N 3/063; G06K 9/6218; G06K 9/6222; G06K 9/6272; G06F 17/18
See application file for complete search history.

(56) References Cited

U.S. PATENT DOCUMENTS

2018/0197081 A1*   7/2018   Ji ................. G06N 3/0454

OTHER PUBLICATIONS

Y.Y. Ou et al., A Novel Radial Basis Function Network Classified with Centers Set by Hierarchical Clustering, IEEE 2005 (Year: 2005).*

(Continued)

*Primary Examiner* — Andrew Caldwell
*Assistant Examiner* — Emily E Larocque
(74) *Attorney, Agent, or Firm* — Thomas | Horstemeyer, LLP

(57) ABSTRACT

Various examples related to automatically composing universal filters are presented. In one example, among others, a system includes processing circuitry that can organize data received by the system into clusters or quasi-orthogonal regions, which are organized based upon a centroid threshold distance. The data can be organized by applying a cluster and retain operation, a cluster and merge operation or a split and retain operation. The system can then determine filter weights based at least in part upon centers of the clusters; update a content addressable filter bank (CAFB) based upon the filter weights; and filter subsequently received data based upon the CAFB. In another example, a method includes receiving and organizing initial data into clusters or quasi-orthogonal regions; determining filter weights based at least in part upon centers of the clusters; updating a CAFB based upon the filter weights; and receiving and filtering subsequent data based upon the CAFB.

20 Claims, 18 Drawing Sheets

(56) References Cited

OTHER PUBLICATIONS

A. Brandstetter et al., Radial Basis Function Networks GPU-Based Implementation, IEEE Transactions on Neural Networks, vol. 19, No. 12, 2008 (Year: 2008).*
B. Chen et al., Quantized Kernel Least Mean Square Algorithm, IEEE Transactions on Neural Networks and Learning Systems, vol. 23, No. 1, 2012 93, 2759-2770, 2013 (Year: 2012).*
S. Jiang et al., An improved K-nearest-neighbor algorithm for text categorization, Expert Systems with Applications 39, 1503-1509, 2012 (Year: 2012).*
V. Nikulin, Threshold-based clustering with merging and regularization in application to network intrusion detection, Computational Statistics and Data Analysis, 51, 1184-1196, 2006 (Year: 2006).*
K. Li, et al., Transfer Learning in Adaptive Filters: The Nearest Instance Centroid-Estimation Kernel Least-Mean-Square Algorithm, IEEE Transaction on Signal Processing, vol. 65, No. 24, Dec. 15, 2017 (Year: 2017).*

* cited by examiner (a) Conventional Kernel Adaptive Filtering (Global Support)

(b) NICE Kernel Adaptive Filtering (Local Support)

Algorithm 1: The NICE-KLMS Algorithm

Initialization:
$d_c$: centroid distance threshold
$a$: kernel parameter
$\eta$: learning rate
$\Omega_1 = \eta y_1 \varphi(\mathbf{u}_1)$: initial weight
$\Omega = \{\Omega_1\}$: set of filters (weights)
$c_1 = \mathbf{u}_1$: centroid for cluster 1
$s_1 = 1$: effective size of cluster 1 for centroid update
$\mathcal{C}_1 = \{\mathbf{u}_1\}$ : center of cluster 1
$\mathcal{C} = \{\mathcal{C}_1\}$: set of clusters

Computation:
while $\{u_i, y_i\}$ *available* do
    Compute minimum centroid distance
    $d_{min}^{(c)} = \min\limits_{1 \leq j \leq |\mathcal{C}|} \|\mathbf{u}_i - c_j\|^2$
    Select nearest-neighbor cluster
    $j^* = \arg\min\limits_{1 \leq j \leq |\mathcal{C}|} \|\mathbf{u}_i - c_j\|^2$
    Compute the output of the $j^*$-th filter, then error
    $\hat{y}_i = \sum\limits_{\ell=1}^{|\mathcal{C}_{j^*}|} \alpha_{j^*}^{(\ell)} \mathcal{K}_a(\mathcal{C}_{j^*}^{(\ell)}, \mathbf{u}_i)$
    $e_i = y_i - \hat{y}_i$

Nearest-Instance-Centroid-Estimation:
    if $d_{min}^{(c)} < d_c$ then
        Update the weights of $j^*$-th filter
        $\Omega_{j^*} = \Omega_{j^*} + \eta e_i \varphi(\mathbf{u}_i)$
        Update cluster $j^*$
        $\mathcal{C}_{j^*} = \{\mathcal{C}_{j^*}, \mathbf{u}_i\}$
        Update cluster $j^*$ centroid, then effective size
        $c_{j^*} = \frac{s_{j^*} c_{j^*} + \mathbf{u}_i}{s_{j^*} + 1}$
        $s_{j^*} = s_{j^*} + 1$
    else
        Form new cluster/filter
        $\mathcal{C}_{|\mathcal{C}|+1} = \{\mathbf{u}_i\}$: new cluster
        $c_{|\mathcal{C}|+1} = \mathbf{u}_i$: centorid
        $s_{|\mathcal{C}|+1} = 1$: effective size
        $\mathcal{C} = \{\mathcal{C}, \mathcal{C}_{|\mathcal{C}|+1}\}$
        *Knowledge Transfer*
        $\Omega_{|\mathcal{C}|+1} = \Omega_{j^*} + \eta e_i \varphi(\mathbf{u}_i)$
        Update set of filters
        $\Omega = \{\Omega, \Omega_{|\mathcal{C}|+1}\}$

FIG. 2A

Algorithm 2: The NICE-(M)-QKLMS Algorithm

Initialization:
$d_c$: centroid distance threshold
$d_q$: quantization distance threshold
$a$: kernel parameter
$\eta$: learning rate
$\Omega_1 = \eta y_1 \varphi(\mathbf{u}_1)$: initial weight
$\Omega = \{\Omega_1\}$: set of filters (weights)
$c_1 = \mathbf{u}_1$: centroid for cluster 1
$s_1 = 1$: effective size of cluster 1 for centroid update
$\mathcal{C}_1 = \{\mathbf{u}_1\}$ : center of cluster 1
$\mathcal{C} = \{\mathcal{C}_1\}$: set of clusters

Computation:
while $\{\mathbf{u}_i, y_i\}$ *available* do

Compute minimum centroid distance
  $d^{(c)}_{min} = \min\limits_{1 \leq j \leq |\mathcal{C}|} \|\mathbf{u}_i - c_j\|^2$
  Select nearest-neighbor cluster
  $j^* = \arg\min\limits_{1 \leq j \leq |\mathcal{C}|} \|\mathbf{u}_i - c_j\|^2$
  Compute the output of the $j^*$-th filter, then error
  $\hat{y}_i = \sum\limits_{\ell=1}^{|\mathcal{C}_{j^*}|} \alpha^{(\ell)}_{j^*} \mathcal{K}_a(\mathcal{C}^{(\ell)}_{j^*}, \mathbf{u}_i)$
  $e_i = y_i - \hat{y}_i$
  Nearest-Instance-Centroid-Estimation:
  if $d^{(c)}_{min} < d_c$ then
    Use minimum quantization distance from above
    $d^{(q)}_{min} = \min\limits_{1 \leq m \leq |\mathcal{C}_{j^*}|} \|\mathbf{u}_i - \mathcal{C}^{(m)}_{j^*}\|^2$
    Select nearest-neighbor center
    $m^* = \arg\min\limits_{1 \leq m \leq |\mathcal{C}_{j^*}|} \|\mathbf{u}_i - \mathcal{C}^{(m)}_{j^*}\|^2$

FIG. 2B

SUMMARY OF THE BEST PREDICTION-GAIN PERFORMANCES.

| Quantization | Filter | (Q)KLMS | | NICE-(Q)KLMS | | |
|---|---|---|---|---|---|---|
| $d_q$ | $L$ | $R_p$ (dB) | Size | $R_p$ (dB) | $d_c(\sigma_k)$ | Size |
| 0 | 8 | 26.54 | 3000 | 26.41 | 11 | 1237.50 |
| 0.05 | 10 | 24.88 | 116 | 24.89 | 14 | 102.25 |
| 0.1 | 9 | 23.12 | 63 | 25.09 | 8 | 37.75 |
| 0.2 | 11 | 21.67 | 49 | 23.68 | 7 | 26.20 |
| 0.3 | 12 | 21.0473 | 41 | 23.29 | 12 | 24.50 |
| 0.4 | 13 | 19.8217 | 35 | 22.62 | 13 | 22.25 |

AUTOMATIC COMPOSITION OF UNIVERSAL FILTERS

CROSS-REFERENCE TO RELATED APPLICATIONS

This application claims priority to, U.S. Patent Application entitled "AUTOMATIC COMPOSITION OF UNIVERSAL FILTERS," filed on Aug. 28, 2017, and assigned application No. 62/550,751, which is incorporated herein by reference in its entirety.

STATEMENT REGARDING FEDERALLY SPONSORED RESEARCH OR DEVELOPMENT

This invention was made with government support under grant number N66001-15-1-4054 awarded by the U.S. Department of Defense, Defense Advanced Research Projects Agency (DARPA). The Government has certain rights in the invention.

BACKGROUND

Any device that captures data from the real world needs a preprocessing filter to clean the signal from noise, or attenuate irrelevant signal features that the users wants to avoid. Moreover, filters are used as models in machine learning and control applications. In addition to be application specific, the development of these filters is a complex process that is both time consuming and computationally intensive.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A and 2B show examples of NICE-KLMS and NICE-QKLMS algorithms, in accordance with various embodiments of the present disclosure.

DETAILED DESCRIPTION

Figure 1:
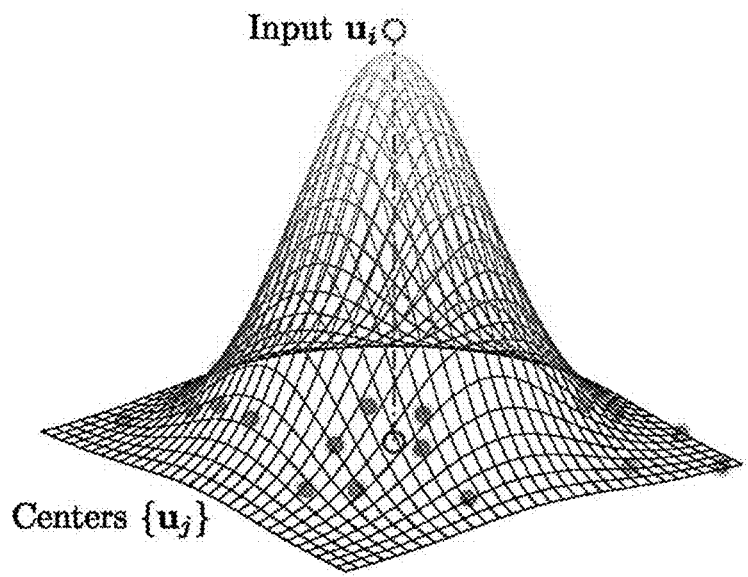
FIG. 1 is a graphical representation illustrating a nearest-instance-centroid-estimation (NICE) network with locally-supported exponentially decaying kernel forming quasi-orthogonal regions or clusters in comparison to a globally-supported conventional kernel, in accordance with various embodiments of the present disclosure.
Figure 1:
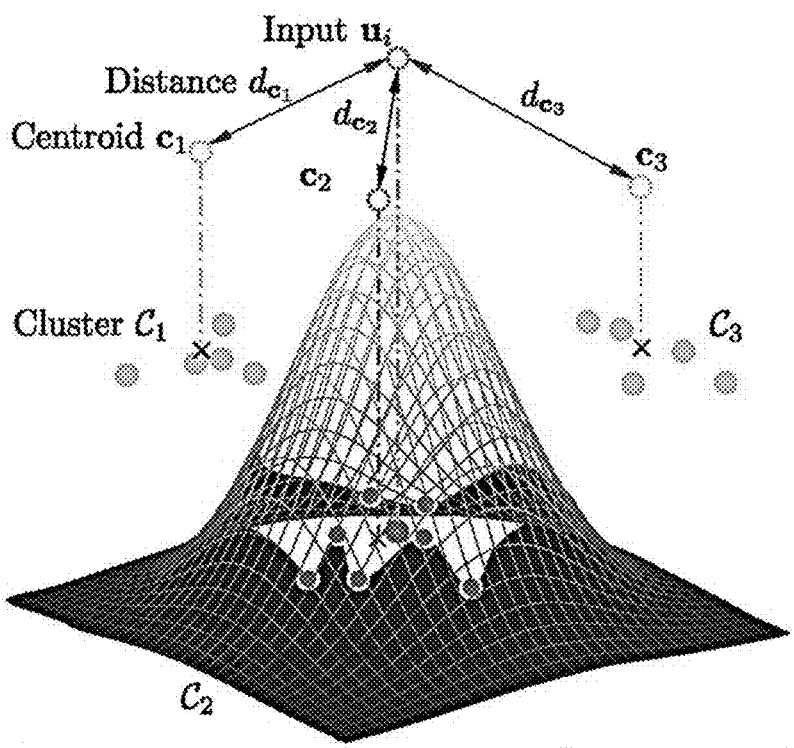

Disclosed herein are various examples of systems and methods related to automatically composing universal filters. Reference will now be made in detail to the description of the embodiments as illustrated in the drawings, wherein like reference numbers indicate like parts throughout the several views.

Kernel methods, such as support vector machine (SVM), kernel principal component analysis (KPCA), and Gaussian process (GP), create a powerful unifying framework for classification, clustering, and regression, with many important applications in machine learning, signal processing, and biomedical engineering. In particular, the theory of adaptive signal processing can be greatly enhanced through the integration of the theory of reproducing kernel Hilbert space (RKHS). By performing classical linear methods in a potentially infinite-dimensional feature space, kernel adaptive filtering (KAF) removes the limitations of the linear model to provide general nonlinear solutions in the original input space. KAF bridges the gap between adaptive signal processing and feedforward artificial neural networks (ANNs), combining the universal approximation property of neural networks and the simple convex optimization of linear adaptive filters.

KAF has gained traction in the scientific community thanks to its usefulness coupled with simplicity, and has been discussed for solving online nonlinear system identification. The kernel least-mean-square (KLMS) algorithm is the simplest feedforward kernel method in the family of kernel adaptive filters. It can be viewed as a growing single-layer neural network, i.e., a finite impulse response (FIR) filter, trained using the LMS algorithm in the RKHS. Other KAF algorithms include the kernel affine projection algorithms (KAPA), kernel recursive least squares (KRLS), and the extended kernel recursive least squares (EX-KRLS) algorithm. While most research has focused on time-delayed feedforward implementations of kernel methods, a recurrent formulation may be utilized to solve nonlinear problems involving non-stationary dynamics. The kernel adaptive autoregressive-moving-average (KAARMA) algorithm can achieve the appropriate memory depth via internal states, by feeding back some or all of the outputs through time-delay units, at the input. As a result, the input and output are no longer independent stationary vectors, but correlated temporal sequences.

A major bottleneck of KAF algorithms is that computation scales with number of samples. When the reproducing kernel is Gaussian, kernel adaptive filters grow linearly like radial basis function (RBF) networks, which poses significant time-space complexity issues for continuous online adaptation. To address this issue, a variety of sparsification and quantization techniques have been proposed to curb the network growth. In batch modes, sparcificaiton has been addressed by pruning and fixed-size approaches. This disclosure considers online adaptive methods. Existing online sample evaluation and selection criteria include the approximate linear dependency (ALD), novelty, prediction variance, surprise, and coherence. The central theme has been to form a compact structure by either eliminating redundant information or minimizing information loss.

One of the most successful method to date, because of simplicity and information preservation, is the vector quantization (VQ) technique introduced in the quantized KLMS (QKLMS) algorithm, which was shown to outperform pruning techniques using the novelty surprise criteria, ALD, and/or prediction variance criteria. Rather than discarding the information associated with redundant data points, VQ updates the coefficients locally within a responsive domain. In practice, only the coefficient of its nearest neighbor is updated. A modified version (M-QKLMS) may be used by computing the exact gradient when performing the VQ coefficient update. Nevertheless, these methods require the participation of all dictionary centers, to evaluate or update the function approximation at any new data sample.

Orthogonal Decomposition Using Exponentially Decaying Kernel

In this disclosure, the concept of a simple instance-based learning data-structure that self organizes essential data points is introduced. The nearest-instance-centroid-estimation (NICE) algorithm is complementary to existing sparsification and VQ techniques. Whereas the others bound the network structure from below, by eliminating redundant basis function centers, NICE bounds the network structure from above, by ignoring centers outside a certain responsive domain. NICE divides the growing sum that defines the filter functional into partial sums (subfilters) that have tight support, e.g., that have nonzero output only in a subregion of the RKHS, naturally forming a compactly-supported reproducing kernel functional. The concept is supported by the fact that a Gaussian function has exponential decay to zero, therefore, if the samples are organized in sufficiently distant clusters, each is approximately orthogonal to the others.

Formally, for a function approximation of the form:

$$\hat{f} = \sum_{i=1}^{N} \alpha_i \phi(u_i, \cdot), \tag{1}$$

where the approximating function $\hat{f}$ is represented as a sum of N Gaussian functions $\phi$, each associated by a different center $u_i$, and weighted by a coefficient $\alpha_i$. Although the Gaussian function has nonzero values over the full space, our computation has finite precision, so the Gaussian tails are effectively zero. Theoretically, this means, we can project $\hat{f}$ onto the subspace defined by N':

$$\text{span}\{\phi(u_j, \cdot): 1 \leq j \leq N'; \text{ and } N' < N\}, \tag{2}$$

obtaining $\hat{f}_s$ (component in the subspace) and $\hat{f}_\perp$ (component perpendicular to the subspace):

$$\hat{f} = \hat{f}_s + \hat{f}_\perp. \tag{3}$$

Using this decomposition, the basis functions can be partitioned into m orthogonal sets (at the machine precision):

$$\hat{f}(u) = \sum_{j=1}^{N^{(1)}} \alpha_j^{(1)} \phi(u_j, u) + \ldots + \sum_{j=1}^{N^{(m)}} \alpha_j^{(m)} \phi(u_j, u) \tag{4}$$

$$= \sum_{j=1}^{N^*} \alpha_j^* \phi(u_j, u)$$

where $\Sigma_{i=1}^m N^{(i)} = N$ and $\langle \phi(u_j), \phi(u) \rangle = 0$ for all $j \notin N^*$. For Gaussian functions, from the kernel trick $\langle \phi(u_j), \phi(u) \rangle = \phi(\|u_j - u\|)$, orthogonality can be approximated using the squared norm to define pseudo-normal bases or neighborhoods, by relaxing the orthogonality constraint to $\langle \phi(u_j), \phi(u) \rangle < \epsilon$ or equivalently approximate $N^* \approx \{u_j : \|u_j - u\| < d_\epsilon\}$, where $\epsilon$ is an arbitrarily small positive quantity and $d_\epsilon$ is the corresponding distance value.

Nearest Neighbor Search: Nearest neighbor search is a computationally intensive operation, especially in high dimensional spaces. Data-space partitioning and search data structure can be utilized, however, on average, a naive linear search outperforms space partitioning approaches on higher dimensional spaces, due to the curse of dimensionality. The incremental nature of the representer theorem at the core of KAF algorithms allows a very simple solution that is heavily based on instantaneous computations. By comparing the current sample with a few representatives of the existing data, rather than every individual sample, and since kernel methods are inherently instance-based learning, there can be diminished return for finer data structures. The need to maintain complex search data structures for a sequentially formed, depth-1 forest can be traded with the centroid of each cluster at the roots. The NICE network can learn the clusters directly from the data, using an intuitive kernel bandwidth metric, and update the centroid locations through an iterative update.

To perform an evaluation, a linear search among the centroids determines the local supports-of-interest. FIG. 1 illustrates a comparison of conventional KAF (global support) and NICE KAF (local support). When updating the filter weights, if the distance between the input data and its nearest-neighbor centroid exceeds a predefined threshold, a new cluster is formed with the input as its centroid. To avoid large discontinuities in learning, the prior knowledge in all the centers or dictionary in this nearest-neighbor cluster are copied or transferred into the new cluster, with one exception: they are not used to update the centroid. On the other hand, if the distance is within the predefined threshold, the input data is added, and a one-step centroid update is performed. Without loss of generality, this spatial clustering approach can be applied to the simplest kernel adaptive filter using LMS update, which can be named the NICE-KLMS algorithm. To show its complementary property to existing RBF network reduction algorithms, the NICE-QKLMS algorithm will be introduced.

The nearest-neighbor search and computation used in NICE is similar to the k-nearest neighbors (k-NN) algorithm only in the sense that the function is approximated locally with respect to its nearest neighbors. However, rather than computing the distances from the test sample to all stored instances and applying weighted averaging, NICE computes the distances between the input and the set of centroids, then applies a standard KAF algorithm on the instances belonging to the nearest-neighbor cluster. Also, the number of centers in each cluster or neighborhood is not predefined, but rather instance-learned directly from data.

Along similar lines, unlike k-means clustering, which aims to partition the observations or centers into a fixed number of clusters with each center belonging to the cluster with the nearest mean, over several epochs, the clusters in NICE are formed instantaneously, using only the predefined distance threshold.

Compared with standard compactly-supported kernels, there is no fixed cut-off distance or range. The concept of a cut-off is only loosely associated with the minimum centroid distance: NICE-KLMS uses a finite subset of local supports rather than using a compactly-supported kernel, e.g., a truncated kernel. A simple thresholding technique used to sparsify an RBF kernel by setting a cut-off distance produces a sparse Gram matrix, but often destroys its positive definiteness. With knowledge transfer, in which out-of-range but close-by centers are copied to form a new cluster, NICE evaluations can extend beyond the neighborhood defined by the minimum centroid distance.

By partitioning the centers into distinct quasi-orthogonal regions, each cluster of NICE can be thought of as a separate filter or subfilter, specializing in different parts of the input/feature space. From this perspective, the NICE framework becomes a content addressable filter bank (CAFB). Instead of frequency bands, the filters are organized by amplitude bands. This CAFB can be incrementally updated for more and more new applications, always using the past-learned filters, opening the door for transfer learning and much more efficient training for new data scenarios, avoiding training from scratch as has been doing since the invention of adaptive filtering.

Compared with multiple and mixture kernel learning, NICE-KLMS uses a single kernel (fixed RKHS) across filters. The appropriate filter (set of weights) is selected based on the minimum centroid distance. In this perspective, the NICE-KLMS can be viewed as a single-kernel multiple- or mixture-filter algorithm. In terms of time-space complexity, instead of running multiple learning algorithms in parallel, as is the case in the mixture model, only one filter is updated by NICE-KLMS at any given time step.

Compared to local-structure based KAF, such as the fixed budget (FB) QKLMS, the network size of NICE-QKLMS is not determined a priori, but rather learned directly from the complexity or dynamic range of the data. The minimum description length (MDL) criterion can be used to adapt the network size, rather than a fixed constant, however it depends on prior knowledge of the locally stationary environment or window size. The only free parameter in NICE, the centroid distance threshold, is conditionally independent of the data, given the appropriate kernel parameter. Since it relates directly to the kernel bandwidth and the shape of the Gaussian is well-understood, it can be set very intuitively. In addition, the two major drawbacks of the existing algorithms are knowledge retention and computational complexity. NICE does not throw away previously learned structures, but rather naturally tucks them away for future use. When the environment changes back to a previous state, QKLMS-FB or QKLM-MDL has no inherent mechanism for recall and has to relearn the structure from scratch. The centroid computation is also significantly more simple to compute than the respective significance measures, e.g., MDL. Furthermore, the NICE paradigm is complementary to most network reduction algorithms and can be used in conjunction.

The following disclosure begins with a brief overview of the KLMS algorithm, and then introduces the novel NICE-KLMS. The mean square convergence analysis for NICE-KLMS is presented using the energy conservation relation, and the performance of the NICE-KLMS algorithm is evaluated with special emphasis on the associative filter storage property of the CAFB framework.

NICE-KLMS Algorithm

First, the KLMS algorithm is briefly discussed, then the NICE extension for KLMS and QKLMS is introduced. In machine learning, supervised learning can be grouped into two broad categories: classification and regression. For a set of N data points $\mathcal{D}=\{u_i,y_i\}_{i=1}^{N}$, the desired output y is either categorical variables (e.g., $y \in \{-1,+1\}$), in the case of binary classification, or real numbers (e.g., $y \in \mathbb{R}$) for the task of regression or interpolation, where $X_1^N \triangleq \{u_i\}_{i=1}^{N}$ is the set of M-dimensional input vectors, i.e., $u_i \in \mathbb{R}^M$, and $y_1^N \triangleq \{y_i\}_{i=1}^{N}$ is the corresponding set of desired vectors or observations. In this disclosure, the focus will be on the latter problem, although the same approach can be used for classification. The task is to infer the underlying function $y=f(u)$ from the given data $\mathcal{D}=\{X_1^N, y_1^N\}$ and predict its value, or the value of a new observation y', for a new input vector u'. Note that the desired data may be noisy in nature, i.e., $y_i = f(u_i) + v_i$, where $v_i$ is the noise at time i, which is assumed to be independent and identically distributed (i.i.d.) Gaussian random variable with zero-mean and unit-variance, i.e., $V \sim \mathcal{N}(0,1)$.

For a parametric approach or weight-space view to regression, the estimated latent function f(u) is expressed in terms of a parameters vector or weights w. In the standard linear form:

$$\hat{f}(u) = w^T u. \tag{5}$$

To overcome the limited expressiveness of this model, the M-dimensional input vector $u \in \mathbb{U} \subseteq \mathbb{R}^M$ (where $\mathbb{U}$ is a compact input domain in $\mathbb{R}^M$) can be projected into a potentially infinite dimensional feature space $\mathbb{F}$. Define a $\mathbb{U} \to \mathbb{F}$ mapping $\Phi(u)$, the parametric model of Equation (5) becomes:

$$\hat{f}(u) = \Omega^T \Phi(u), \tag{6}$$

where $\Omega$ is the weight vector in the feature space.

Using the Representer Theorem and the "kernel trick", Equation (6) can be expressed as:

$$\hat{f}(u) = \sum_{i=1}^{N} \alpha_i \mathcal{K}(u_i, u), \tag{7}$$

where K(u, u') is a Mercer kernel, corresponding to the inner product $\langle \Phi(u), \Phi(u') \rangle$, and N is the number of basis functions or training samples. Note that $\mathbb{F}$ is equivalent to the reproducing kernel Hilbert spaces (RKHS) induced by the kernel if identified as $\Phi(u) = K(u,\cdot)$. The most commonly used kernel is the Gaussian kernel $$\mathcal{K}_a(u,u') = \exp(-a\|u-u'\|^2), \tag{8}$$

where a>0 is the kernel parameter. Without loss of generality, the focus is on the kernel least-mean-square algorithm, which is the simplest KAF algorithm.

The learning rule for the KLMS algorithm in the feature space follows the classical linear adaptive filtering algorithm, the LMS:

$$\begin{cases} \Omega_0 = 0 \\ e_i = y_i - \langle \Omega_{i-1}, \Phi(u_i) \rangle, \\ \Omega_i = \Omega_{i-1} + \eta e_i \Phi(u_i) \end{cases} \quad (9)$$

which, in the original input space, becomes $$\begin{cases} \hat{f}_0 = 0 \\ e_i = y_i - \hat{f}_{i-1}(u_i) \\ \hat{f}_i = \hat{f}_{i-1} + \eta e_i \mathcal{K}(u_i, \cdot) \end{cases} \quad (10)$$

where $e_i$ is the prediction error in the i-th time step, $\eta$ is the learning rate or step-size, and $f_i$ denotes the learned mapping at iteration i. Using KLMS, the mean of y can be estimated with linear per-iteration computational complexity O(N), making it an attractive online algorithm.

Nearest Instance Centroid Estimation

As described in the previous section, the NICE algorithm operates under the framework of subspace decomposition by organizing new sample points into existing clusters (quasi-orthogonal regions) or forming new ones based on the minimum centroid distance $d_{min}^{(c)}$ and the threshold distance $d_c$. For continuous online adaptation of the KLMS algorithm, the first data sample can be used to initialize a cluster, which also serves as its centroid and the weight of the KAF associated with the first cluster. For each subsequent data point, the minimum centroid distance is computed, resulting in two types of operations:

1) Cluster: If the minimum centroid distance is less than the predefined threshold, i.e., $d_{min}^{(c)} < d_c$, the sample is assigned to its nearest neighbor cluster. It is then used to update the corresponding filter's weights and the centroid location.
2) Split: Otherwise, the sample is used to form a new cluster, its centroid, and the corresponding weights of a new filter.

Clearly, the Cluster operation does not change the behavior of the KLMS algorithm, except that instead of updating the weights of a global filter, each new sample is assigned to a local filter associated with its nearest cluster or region in the input/feature space. The Split operation, on the other hand, carves out a new local region. If we allow the kernel adaptive filter associated with this new cluster to be initialized from scratch with just one sample, it results in a performance discontinuity in time. For continuous learning, this jump becomes insignificant in the long run. However, for short term update, these can be avoided by copying the weights from its nearest-neighbor cluster (out-of-range in terms of the centroid distance threshold, but spatially, still the closest). This can be viewed as a smoothing procedure. In the worst case, the last cluster will retain a dictionary size equivalent to KLMS (if it is passed from one cluster to the next in its entirety), however with probability zero. For this to happen, the data would have to be preorganized by cluster and presented to the algorithm in order. An exponentially decaying term $\lambda$ can be used to gradually diminish the effects of the copied coefficients in that particular part of the space. These initial samples can also be removed when their contributions fall below a certain threshold, as new samples are brought into the cluster. More elaborate schemes such as MDL can be used to further reduce the cluster size. Note that the out-of-range centers associated with these weights will never be used to update the centroid location. Since the centroid is the geometric mean of the vector space, its location can be easily updated with a one-step operation using its previous location, the number of existing within-cluster centers, and the new data point.

Since the Gaussian kernel is isotropic, and the interval estimation and coverage probability of a normal distribution are known, and for convenience and intuition, the NICE centroid distance threshold $d_c$ can be expressed in terms of the unnormalized standard deviation. The unnormalized Gaussian-kernel standard deviation $\sigma_k$ is defined with respect to the kernel parameter a in Equation (8) as:

$$\sigma_k \triangleq \sqrt{\frac{1}{2a}}. \quad (11)$$

Figure 2B:
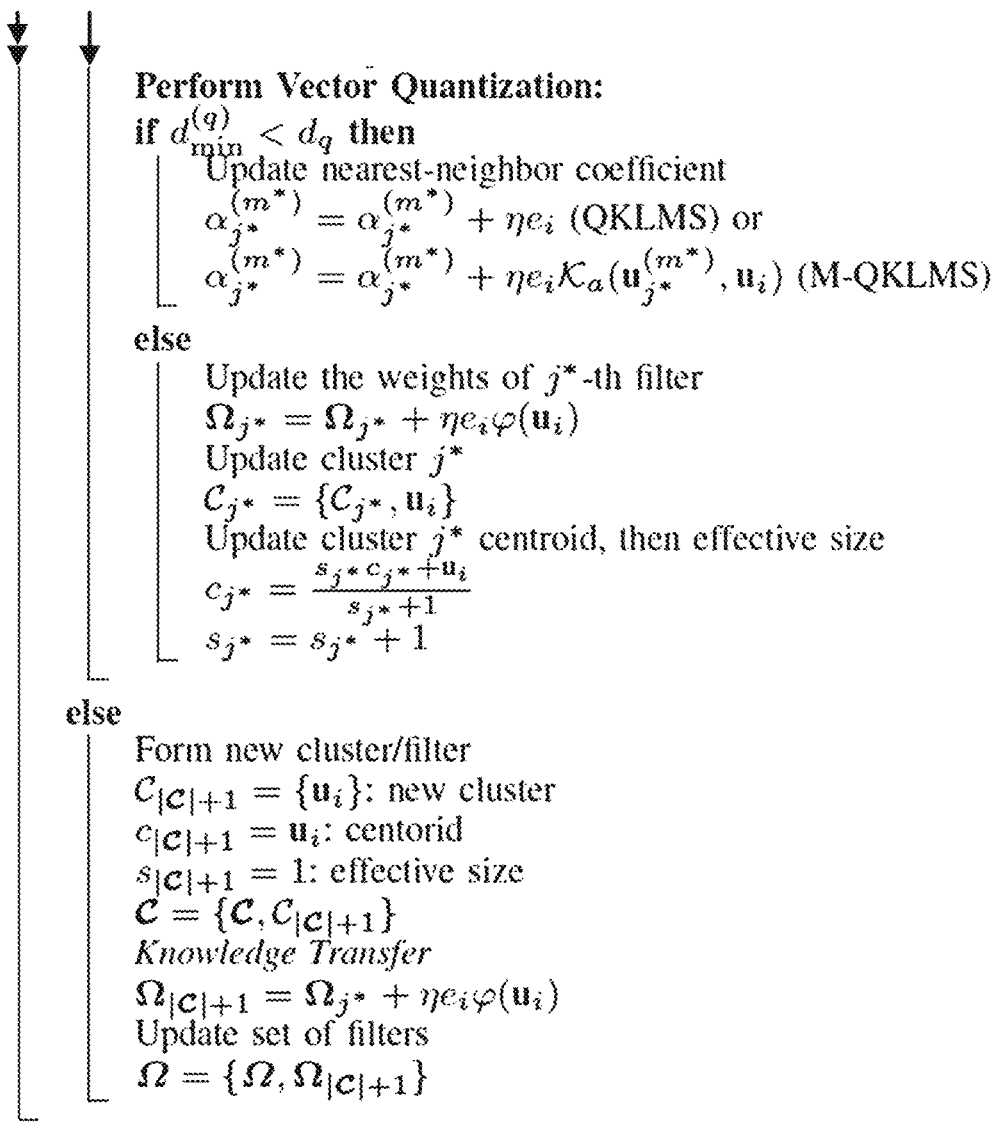

An example of the NICE-KLMS algorithm is summarized by the algorithm of FIG. 2A.

The NICE-KLMS algorithm behaves identically to KLMS when the number of clusters is fixed at one, i.e., an infinite centroid distance threshold or $d_c = \infty$. In practice, it runs much faster than KLMS, since the number of centers needed per cluster/filter is significantly fewer, and on average, the number of clusters (operations need to select the appropriate filter) is significantly smaller than the average size of individual clusters, i.e., $|C| \ll |\bar{C}|$.

Vector Quantization

Figure 3:
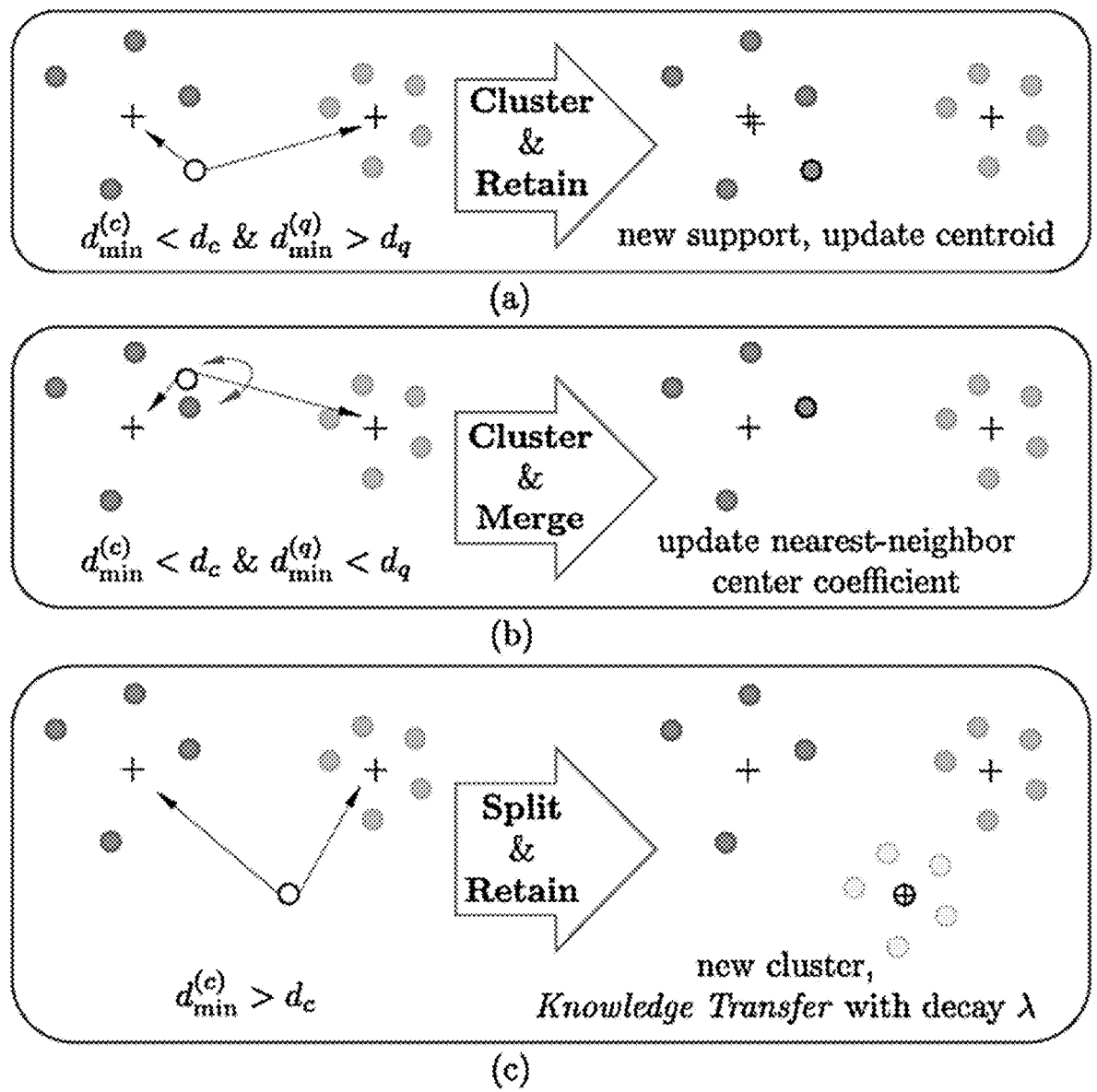
FIG. 3 is a graphical representation illustrating three main types of operations in the NICE-QKLMS algorithm of FIG. 2B, in accordance with various embodiments of the present disclosure.

As noted above, the vector quantization technique in QKLMS is complementary to NICE, and can be combined to further reduce the network structure and run-time complexity. Each of the within-cluster centers can be viewed as a mini centroid and compacted using a quantization distance threshold $d_q$. An example of the NICE-QKLMS algorithm is presented in the algorithm of FIG. 2B. Just like KLMS can be viewed as a special case of NICE-KLMS, when the centroid distance threshold is infinity, i.e., $d_c = \infty$, the NICE-KLMS algorithm is a special case of NICE-QKLMS, when the quantization distance threshold is zero, $d_q = 0$. Together, the two thresholds bound the RBF network size from above and below. This generalized approach comprises three main types of operations, which are illustrated in FIG. 3:

(a) Cluster & Retain: If the minimum centroid distance is less than the predefined threshold, with $d_{min}^{(c)} < d_c$, the sample is assigned to its nearest-neighbor cluster. Furthermore, if the minimum quantization (q) distance is greater than the predefined threshold ($d_{min}^{(q)} > d_q$), computed inside the nearest-neighbor cluster, the data sample is retained and used to update the corresponding filter's weights and the centroid location. Note, that $d_{min}^{(q)}$ can be obtained efficiently during the filtering procedure, and does not require a separate loop.
(b) Cluster & Merge: From the above operation, if the newly assigned data sample's quantization distance is smaller than the threshold ($d_{min}^{(q)} < d_q$), the sample is effective merged inside its nearest-neighbor center. Cluster size and centroid location remains the same. Only the coefficient of its nearest neighbor is updated, using the filter-output error.

(c) Split & Retain: Otherwise, if $d_{min}^{(c)} > d_c$, the new sample is used to form a new cluster, its centroid, and the corresponding weights of a new filter. To avoid short-term learning discontinuity, the nearest-neighbor cluster weights are carried over. The worst-case dictionary size does not necessarily scale linearly with the number of clusters, since any additional center has to always meet the global quantization constraint. The worst-case computational complexity of NICE-QKLMS is the same as QKLMS, since the centroid computation is considered constant (with the number of clusters<<centers). However, in practice, NICE performs much faster, since the worst-case scenario occurs with probability zero. Furthermore, an exponentially decaying term $\lambda$ can be used to gradually diminish the effects of the copied coefficients.

In the case that the minimum VQ distance is less than the predefined threshold (Cluster & Merge), QKLMS assumes the current input is a direct copy of its nearest neighbor, thus only updating the coefficients with the instantaneous error. This is an approximation with practical value. A more appropriate treatment is to update the coefficient using convex optimization or gradient descent, in this case. The exact error gradient with respect to the closest-neighbor coefficient $\alpha_i^*$ can be determined as:

$$\frac{\partial \varepsilon_i}{\partial \alpha_{i*}} = \frac{\partial e_i^2}{2\partial \alpha_{i*}} = -e_i \frac{\partial y_i}{\partial \alpha_{i*}} = -e_i \mathcal{K}_a(u_{i*}, u_i), \quad (12)$$

where $\varepsilon_i = e_i^2/2$ is the cost function. Clearly, the instaneous error $e_i$ needs to be scaled by a kernel evaluation between the current input $u_i$ and its nearest neighbor $u_i^*$. This formulation is termed the modified or M-QKLMS. This option is reflected in the algorithm of FIG. 2B. Note that comparison of the merits of existing sparsification and quantization techniques is outside the scope of this disclosure. The emphasis, here, is to show that NICE is complementary to most existing algorithms and can be applied in integration.

NICE-QKLMS Mean-Square-Convergence Analysis

Here, the energy conservation relation for adaptive filtering can be used to show the sufficient condition for mean square convergence of the NICE-QKLMS algorithm. The upper and lower steady-state excess-mean-square-error bounds can also be established. Two simplifying hypothesis can be imposed here: the clustering operation that was discussed above is optimal, i.e., no errors in clustering have been introduced, and that the orthogonalization amongst clusters is exact. First, let a general nonlinear model be defined as:

$$d_i = f(u_i) + v_i, \quad (13)$$

where $d_i$ is the noisy measurement or desired value, $f(\cdot)$ is the unknown nonlinear mapping, and $v_i$ denotes measurement noise. In this disclosure, the focus is on the following class of kernel adaptive filtering algorithms defined in Equation (6). The universal approximation property states that there exists a vector $\Omega^*$ such that $f(\cdot) = \Omega^{*T}\psi(\cdot)$. The prediction error becomes:

$$e_i = d_i - \Omega_{i-1}^T \psi(u_i) \quad (14)$$
$$= \Omega^{*T}\psi(u_i) - \psi_{i-1}^T \psi(u_i) + v_i$$
$$= \tilde{\Omega}_{i-1}^T \psi(u_i) + v_i,$$

where $\tilde{\Omega}_{i-1}^T \triangleq \Omega^{*T} - \Omega_{i-1}^T$ is the weight error vector in the functional space $\mathbb{F}$. The steady-state mean-squared-error (MSE) of an adaptive filter is defined as $$MSE \triangleq \lim_{i\to\infty} E[\|e_i\|^2] = \lim_{i\to\infty} E\left[\left\|\tilde{\Omega}_{i-1}^T \psi(u_i) + v_i\right\|^2\right]. \quad (15)$$

Under the widely-used and often realistic assumption
A.1: The additive noise $v_i$ is zero-mean with variance $\sigma_v^2$, independent and identically distributed (i.i.d.), and statistically independent of the input sequence $\psi(u_i)$,
the steady-state MSE in Equation (15) reduces to:

$$MSE = \lim_{i\to\infty} E\left[\left\|\tilde{\Omega}_{i-1}^T \psi(u_i)\right\|^2\right]. \quad (16)$$

If it is further assumed that:
A.2: The input vector $\psi(u_i)$ is independent of then the MSE expression becomes:

$$MSE = \lim_{i\to\infty} Tr(C_{i-1} R), \quad (17)$$

where $C_i$ is the weight error covariance matrix, i.e., $C_i \triangleq E[\tilde{\Omega}_{i-1}^T \tilde{\Omega}_{i-1}]$ and $R \triangleq E[\psi(u_i)^T \psi(u_i)]$.

Conservation of Energy for Kernel Adaptive Filtering

First, define the a priori and a posteriori estimation errors, $e_i^-$ and $e_i^+$ respectively, as:

$$e_i^- \triangleq \tilde{\Omega}_{i-1}^T \psi(u_i), \quad (18)$$

$$e_i^+ \triangleq \tilde{\Omega}_i^T \psi(u_i). \quad (19)$$

Substituting Equation (18) into Equation (14) yields the following relation between the error terms $\{e_i, e_i^-\}$:

$$e_i = e_i^- + v_i. \quad (20)$$

Subtracting the optimal weight $\Omega^*$ from both sides of the weight update equation, then multiplying both sides by the feature space input $\psi(u_i)$, from the right, gives:

$$\Omega_i = \Omega_{i-1} + \eta e_i \psi(u_i)$$

$$\Omega_i - \Omega^* = \Omega_{i-1} - \Omega^* + \eta e_i \Omega(u_i) \quad (21)$$

$$\tilde{\Omega}_i^T \psi(u_i) = \tilde{\Omega}_{i-1}^T \psi(u_i) - \eta e_i \psi(u_i)^T \psi(u_i) \quad (22)$$

$$e_i^+ = e_i^- - \eta e_i \mathcal{K}(u_i, u_i)$$

$$\eta e_i = e_i^- - e_i^+, \quad (23)$$

since $\mathcal{K}(u_i, u_i) = \mathcal{K}(\|u_i - u_i\|^2) = 1$. Substituting Equation (23) into Equation (21) yields the following weight-error vector update rule:

$$\Omega_i - \Omega^* = \Omega_{i-1} - \Omega^* + (e_i^- - e_i^+)\psi(u_i)$$

$$\tilde{\Omega}_i = \tilde{\Omega}_{i-1} - (e_i^- - e_i^+)\psi(u_i). \quad (24)$$

To evaluate the energy conservation of Equation (24), square both sides, yielding:

$$\tilde{\Omega}_i^T \tilde{\Omega}_i = \tilde{\Omega}_{i-1}^T \tilde{\Omega}_{i-1} + (e_i^- - e_i^+)^2 \psi(u_i)^T \psi(u_i) - \qquad (25)$$
$$2(e_i^- - e_i^+)\tilde{\Omega}_{i-1}^T \psi(u_i)$$
$$= \tilde{\Omega}_{i-1}^T \tilde{\Omega}_{i-1} + ((e_i^-)^2 - 2e_i^- e_i^+ + (e_i^+)^2)\mathcal{K}(u_i, u_i) -$$
$$2(e_i^- - e_i^+)e_i^-$$
$$= \tilde{\Omega}_{i-1}^T \tilde{\Omega}_{i-1} - (e_i^-)^2 + (e_i^+)^2,$$

or, in shorthand notation:
$$\|\tilde{\Omega}_i\|_F^2 + (e_i^-)^2 = \|\tilde{\Omega}_{i-1}\|_F^2 + (e_i^+)^2, \qquad (26)$$

which describes how the energies of the weight-error vectors for two successive time instants i−1 and i are related to the energies of the a priori and a posteriori estimation errors.

Steady-State MSE Performance Analysis

In the steady state, the following assumption holds:

$$\lim_{i \to \infty} E[\|\tilde{\Omega}_i\|_F^2] = E[\|\tilde{\Omega}_{i-1}\|_F^2], \qquad (27)$$

where the mean square deviation converges to a steady-state value. In the steady state, the effect of the weight-error vector cancels out. Taking the expectation on both sides of Equation (26) yields:

$$E[\|\tilde{\Omega}_i\|_F^2] + E[(e_i^-)^2] = E[\|\tilde{\Omega}_{i-1}\|_F^2] + E[(e_i^+)^2]. \qquad (28)$$

Substituting the expression for the a posteriori estimation error $e_i^+$ in Equation (23) into the right-hand side of Equation (28) gives $$E[\|\tilde{\Omega}_i\|_F^2] + E[(e_i^-)^2] = E[\|\tilde{\Omega}_{i-1}\|_F^2] + E[(e_i^- - \eta e_i)^2]$$
$$E[\|\tilde{\Omega}_i\|_F^2] + E[\|\tilde{\Omega}_{i-1}\|_F^2] - 2\eta E[e_i e_i^-] + \eta^2 E[e_i^2]. \qquad (29)$$

Clearly, a sufficient condition for mean square convergence is to ensure a monotonic decrease of the weight-error power $E[\|\tilde{\Omega}_i\|_F^2]$, or:

$$-2\eta E[e_i e_i^-] + \eta^2 E[e_i^2] \le 0. \qquad (30)$$

Since the step size is lower bounded by 0, from Equations (30) and (20), then:

$$0 < \eta \le \frac{2E[e_i e_i^-]}{E[e_i^2]} = \frac{2E[(e_i^- + v_i)e_i^-]}{E[(e_i^- + v_i)^2]} \stackrel{(a)}{=} \frac{2E[(e_i^-)^2]}{E[(e_i^-)^2] + \sigma_v^2}, \qquad (31)$$

where equality (a) follows from A.1, i.e., the cross-term $E[v_i e_i^-] = E[v_i]E[e_i^-] = 0$. From Equation (31), the following sufficient condition can be obtained:

$$0 < E[(e_i^-)^2] = E\left[\left(\tilde{\Omega}_{i-1}^T \psi(u_i)\right)^2\right] \qquad (32)$$
$$= E[\tilde{\Omega}_{i-1}^T \psi(u_i)\psi^T(u_i)\tilde{\Omega}_{i-1}]$$
$$\stackrel{(b)}{=} [\|\tilde{\Omega}_{i-1}\|_F^2],$$

where equality (b) follows from the kernel trick. Summarizing the sufficient conditions below:

$$\boxed{\begin{aligned} E[\|\tilde{\Omega}_{i-1}\|_F^2] &> 0 \\ 0 < \eta &\stackrel{(a)}{\le} \frac{2E[(e_i^-)^2]}{E[(e_i^-)^2] + \sigma_v^2}, \end{aligned}} \qquad (33)$$

it can be seen that for weight adaptation in $\mathbb{F}$ using the current feature space input $\psi(u_i)$, as long as the step size $\eta$ is appropriately selected according to Equation (31), the NICE-KLMS algorithm converges in an identical fashion as KLMS.

At steady state, the excess mean-squared error (EMSE) is given by simple manipulation of Equations (30) and (31):

$$\lim_{i \to \infty} 2\eta E[e_i e_i^-] = \lim_{i \to \infty} \eta^2 E[e_i^2] \qquad (34)$$
$$\lim_{i \to \infty} 2E[(e_i^-)^2] \stackrel{(c)}{=} \lim_{i \to \infty} \eta E[(e_i^-)^2]$$
$$\boxed{\lim_{i \to \infty} E[(e_i^-)^2] = \frac{\eta \sigma_v^2}{(2 - \eta)}.}$$

For the three operations of NICE-QKLMS, how the mean square convergence and steady-state EMSE are affected is shown.

Cluster & Retain:

Let the a priori weight vector for cluster $C_c$ be denoted by $\Omega_{i-1}^{(c)}$. Updating the weight vector using the current input $\psi(u_i)$ does not change the behavior of the mean square convergence or EMSE.

Cluster & Merge:

Instead of using the current input $\psi(u_i)$ to update the weight vector for cluster c, its nearest within-cluster neighbor $\psi(u_q^{(c)})$ is used, i.e., $\Omega_i = \Omega_{i+1} + \eta e_i \psi(u_q^{(c)})$, where $u_q^{(c)} = \arg\min \|u_i - U^{(c)}\|$. This affects the kernel trick used to simplify the expressions throughout the steady-state MSE performance analysis. The simple identity $\mathcal{K}(\psi(u_i), \psi(u_i)) = 1$ is no longer valid, but rather, the value is bounded by a factor q>0, i.e., $\mathcal{K}(\|u_i - u_q^{(c)}\|^2 \le q) \ge \exp(-aq)$.

This introduces a new energy conservation relation. Substituting the current input with its nearest within-cluster neighbor in Equation (22) gives:

$$\left(-\tilde{\Omega}_i^T\right)\psi(n_i) = \left(-\tilde{\Omega}_{i-1}^T\right)\psi(u_i) + \eta e_i \psi(u_q^{(c)})^T \psi(u_i) \qquad (35)$$
$$e_i^+ = e_i^- - \eta e_i \mathcal{K}(u_q^{(c)}, u_i)$$
$$\eta e_i = \frac{e_i^- - e_i^+}{\mathcal{K}(u_q^{(c)}, u_i)}.$$

Substituting this new expression that relates the three error terms $\{e_i^+, e_i^-, e_i\}$ during the merge update for Equation (23) in Equation (21), the energy conservation relation in Equation (26) becomes:

$$\|\tilde{\Omega}_i\|_F^2 = \|\tilde{\Omega}_{i-1}\|_F^2 - 2\frac{e_i^- - e_i^+}{\mathcal{K}(u_q^{(c)}, u_i)}\tilde{\Omega}_{i-1}^T \psi(u_q^{(c)}) + \qquad (36)$$
$$\frac{(e_i^- - e_i^+)^2}{\mathcal{K}^2(u_q^{(c)}, u_i)}\psi(u_q^{(c)})^T \psi(u_q^{(c)})$$
$$= \|\tilde{\Omega}_{i-1}\|_F^2 + \frac{(e_i^+)^2 - (e_i^-)^2}{\mathcal{K}^2(u_q^{(c)}, u_i)} +$$
$$\underbrace{\frac{2(e_i^+ - e_i^-)(\tilde{\Omega}_{i-1}^T \psi(u_q^{(c)})\mathcal{K}(u_q^{(c)}, u_i) - e_i^-)}{\mathcal{K}^2(u_q^{(c)}, u_i)}}_{J_q},$$

where $$J_q \triangleq \frac{2(e_i^+ - e_i^-)(\tilde{\Omega}_{i-1}^T \psi(u_q^{(c)}) \mathcal{K}(u_q^{(c)}, u_i) - e_i^-)}{\mathcal{K}^2(u_q^{(c)}, u_i)}$$

denotes the quantization energy due to the merge operation. It follows that:

$$\|\tilde{\Omega}_i\|_F^2 + \frac{(e_i^-)^2}{\mathcal{K}^2(u_q^{(c)}, u_i)} = \|\tilde{\Omega}_{i-1}\|_F^2 + \frac{(e_i^+)^2}{\mathcal{K}^2(u_q^{(c)}, u_i)} + J_q. \quad (37)$$

In the limit as the quantization factor $q \to 0$, i.e., $$\lim_{q \to 0} u_q^{(c)} = u_i,$$

the quantization energy $J_q \to 0$ and Equation (37) reduces to Equation (26).

Again, using Equation (35), the sufficient conditions for mean square convergence in Equation (33) becomes:

$$\boxed{\begin{array}{l} E[\tilde{\Omega}_{i-1}^T \mathcal{K}(u_q^{(c)}, u_i) \tilde{\Omega}_{i-1}] > 0 \\ 0 < \eta \leq \dfrac{2E[e_i^- \tilde{\Omega}_{i-1}^T \psi(u_q^{(c)})]}{E[(e_i^-)^2] + \sigma_v^2} \end{array}}, \quad (38)$$

which is satisfied with an appropriately selected step size and a sufficiently small quantization factor $q$ such that $\mathcal{K}(\|u_q^{(c)} - u_i\|^2) > 0$. It follows that the steady-state EMSE is:

$$\begin{aligned} \eta\left(\lim_{i\to\infty} E[(e_i^-)^2 + \sigma_v^2]\right) &= 2\lim_{i\to\infty} E[e_i^- \tilde{\Omega}_{i-1}^T \psi(u_q^{(c)})] \\ &= 2\lim_{i\to\infty} E[e_i^- \tilde{\Omega}_{i-1}^T (\psi(u_i) - \psi(u_i) + \psi(u_q^{(c)}))] \\ &= 2\lim_{i\to\infty} \left(E[(e_i^-)^2] + E[e_i^- \tilde{\Omega}_{i-1}^T (\psi(u_q^{(c)}) - \psi(u_i))]\right) \\ \lim_{i\to\infty} E[(e_i^-)^2] &= \frac{\eta \sigma_v^2 - 2 \lim_{i\to\infty} E[e_i^- \tilde{\Omega}_{i-1}^T (\psi(u_q^{(c)}) - \psi(u_i))]}{2 - \eta}. \end{aligned} \quad (39)$$

The expected value in the numerator, on the right-hand side of Equation (39), can be expanded as:

$$\begin{aligned} E[e_i^- \tilde{\Omega}_{i-1}^T (\psi(u_q^{(c)}) - \psi(u_i))] &= E[\tilde{\Omega}_{i-1}^T \psi(u_i) \tilde{\Omega}_{i-1}^T (\psi(u_q^{(c)}) - \psi(u_i))] \\ &= E[\tilde{\Omega}_{i-1}^T \psi(u_i)(\psi(u_q^{(c)}) - \psi(u_i))^T \tilde{\Omega}_{i-1}] \\ &= E[\tilde{\Omega}_{i-1}^T \langle \psi(u_i), \psi(u_q^{(c)}) - \psi(u_i) \rangle \tilde{\Omega}_{i-1}] \\ &\stackrel{(c)}{=} E[\tilde{\Omega}_{i-1}^T \langle \psi(u_q^{(c)}) - \psi(u_i), \psi(u_i) \rangle \tilde{\Omega}_{i-1}] \\ &\stackrel{(d)}{=} E[\tilde{\Omega}_{i-1}^T (\langle \psi(u_q^{(c)}), \psi(u_i) \rangle - \langle \psi(u_i), \psi(u_i) \rangle) \tilde{\Omega}_{i-1}] \\ &\stackrel{(e)}{=} E[(\mathcal{K}(u_q^{(c)}, u_i) - \mathcal{K}(u_i, u_i)) \tilde{\Omega}_{i-1}^T \tilde{\Omega}_{i-1}] \\ &\stackrel{(f)}{=} (E[\exp(-a\|u_i - u_q^{(c)}\|^2)] - 1) E[\|\tilde{\Omega}_{i-1}\|_F^2], \end{aligned} \quad (40)$$

where equalities (c) and (d) follow from the symmetry property and the scaling-and-distributive property of RKHS, respectively, equality (e) holds because inner products are scalars, and equality (f) results from A.2.

Since the maximum squared distance for the merge operation is determined by the quantization factor q, it follows that Equation (40) is bounded as:

$$(\exp(-aq) - 1) E[\|\tilde{\Omega}_{i-1}\|_F^2] \leq (E[\exp(-a\|u_i - u_q^{(c)}\|^2)] - 1) E[\|\tilde{\Omega}_{i-1}\|_F^2] \leq 0, \quad (41)$$

where the upper-bound is achieved when the current input is an existing support, i.e., $u_q^{(c)} = u_i$.

Substituting Equations (40) and (41) into Equation (39) yields the following bounds for the NICE-QKLMS EMSE:

$$\frac{\eta \sigma_v^2}{(2 - \eta)} \leq \lim_{i\to\infty} E[(e_i^-)^2] \quad (42)$$

$$\leq \frac{\eta \sigma_v^2 + 2(1 - \exp(aq)) \lim_{i\to\infty} E[\|\tilde{\Omega}_{i-1}\|_F^2]}{(2 - \eta)}.$$

Compared to equation (34), the NICE-KLMS is a special case of NICE-QKLMS. The universal approximation property and the mean square convergence of Equation (38) indicates that:

$$\lim_{i\to\infty} E[\|\tilde{\Omega}_{i-1}\|_F^2] = 0, \quad (43)$$

when i approaches infinity and the quantization factor is zero, i.e., given infinite training data and no quantization. Note that this is the average asymptotic behavior for the ensemble of KLMS filters; individual performance using finite training data may vary.

Split & Retain:

Creating a new cluster c' and updating the new weight vector $\Omega_{i-1}^{(c')}$ using the current input $\psi(u_i)$ does not change the behavior of the mean square convergence or EMSE. As long as these operations are maintained, which are essentially the same building blocks of QKLMS, the mean square convergence is not changed from the QKLMS analysis.

Simulation Results

Here, the performance of the proposed NICEKLMS algorithm and the generalized NICE-QKLMS algorithm was evaluated, for the task of short-term chaotic time series prediction and transfer learning. Since the QKLMS algorithm has been studied extensively and established as the state-of-the-art performer for curbing the growth of the RBF structure in kernel adaptive filtering, the comparisons were focused on the QKLMS algorithm. Specifically, is is shown that the NICE-QKLMS algorithm can outperform the QKLMS algorithm, using finite training data, with fewer data centers per evaluation. And under the framework of transfer learning, NICE-QKLMS can leverage previously learned knowledge, i.e., filter parameters, to related task or domain.

Mackey-Glass Time Series Prediction

First, the NICE-QKLMS was tested on the Mackey-Glass (MG) chaotic time series. It was generated using the following time-delay ordinary differential equation:

$$\frac{dx(t)}{dt} = \frac{\beta x(t-\tau)}{1+x(t-\tau)^n} - \gamma x(t), \text{ where } \beta, \gamma, n > 0, \quad (44)$$

with $\beta=0.2$, $\gamma=0.1$, $\tau=30$, and discretized at a sampling period of 6 seconds. Chaotic dynamics are highly sensitive to initial conditions: small differences in initial conditions produce widely diverging outcomes, rendering long-term prediction intractable in general. Additive Gaussian noise with zero-mean and standard deviation $\sigma_n=0.04$, i.e., V~ $\mathcal{N}(0, 1.6\times 10^{-3})$, were introduced. The time-delay embedding length or filter length was set at L=12; learning rate for all algorithms at $\eta=0.1$; kernel parameter for all three KAF algorithms at a=1; the quantization threshold at $d_q=0.1$ for QKLMS and NICE-QKLMS; and the centroid distance threshold for NICE-QKLMS at $d_c=3\sigma_k=2.1213$. The training set consisted of 3000 consecutive samples. Testing was comprised of 400 independent samples.

Figure 4:
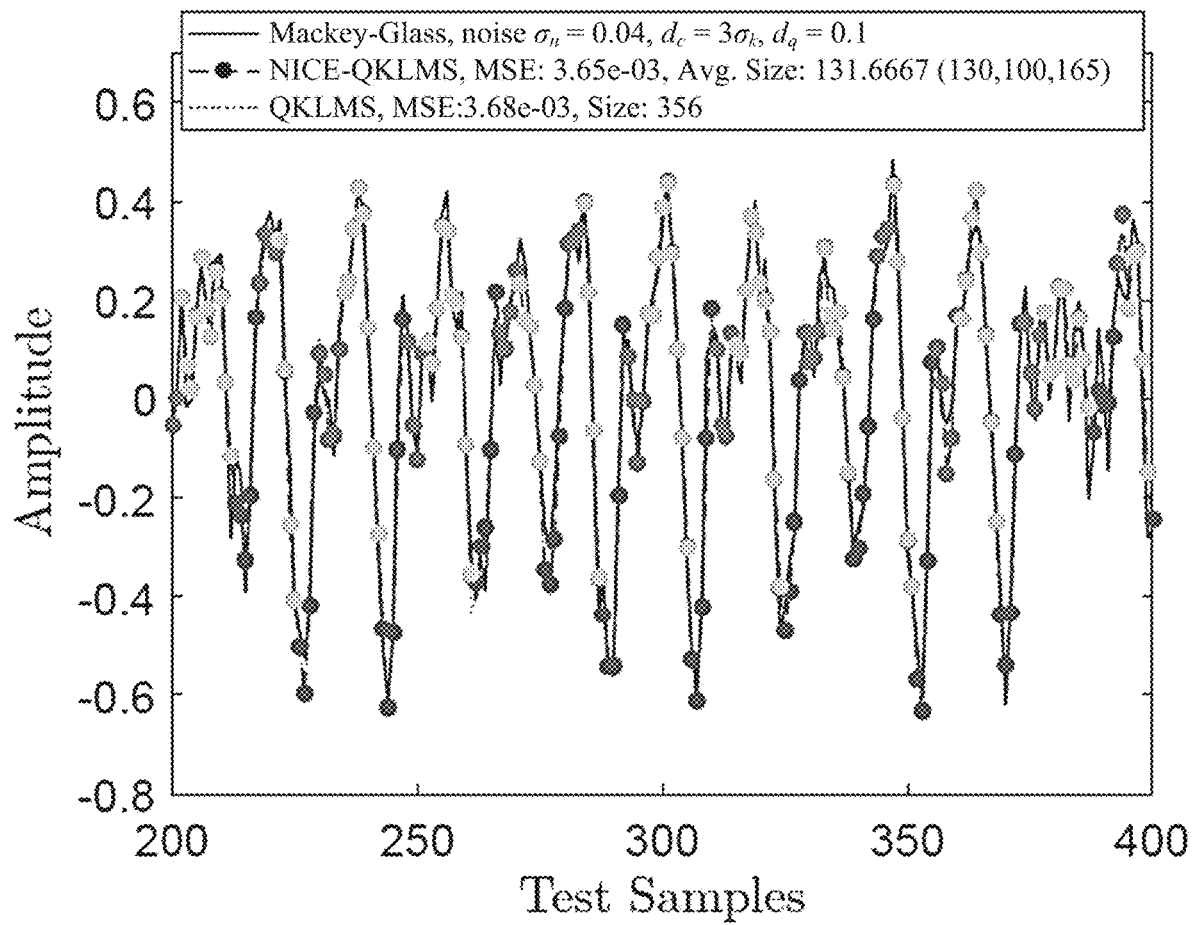
FIG. 4 is a snapshot of an example of a single trial Mackey-Glass chaotic time series prediction performance-comparison between QKLMS and NICE-QKLMS, in accordance with various embodiments of the present disclosure.

Referring to FIG. 4, shown is a snapshot of an example of a single trial Mackey-Glass chaotic time series prediction performance-comparison between QKLMS and NICE-QKLMS, on the testing set with additive zero-mean Gaussian noise ($\sigma_n=0.04$). The NICE-QKLMS predictions are color-coded using dot marker symbols, with each color (or shade) corresponding to a different cluster. Both algorithms use the same quantization threshold of $d_q=0.1$. NICE-QKLMS has an additional parameter to partition training samples into clusters, using the centroid distance threshold of $3\sigma_k$, with respect to the Gaussian kernel width. It can be seen that the NICE-QKLMS predictions form three distinct spatial regions or clusters (some distorted by noise), each corresponding to a different filter. Only one cluster-filter was used per input sample, and the selection process took only three distance comparisons with the respectively cluster centroids. Compared to the 349 centers used for QKLMS, NICE-QKLMS uses roughly a third of the centers (average number of centers for the three filters is 130). This was expected since NICE-QKLMS segments the data into three sets, with overlaps due to transient-smoothing or knowledge transfer during training. In the training process, the earlier the clusters are determined, the smaller the overlaps.

Figure 5:
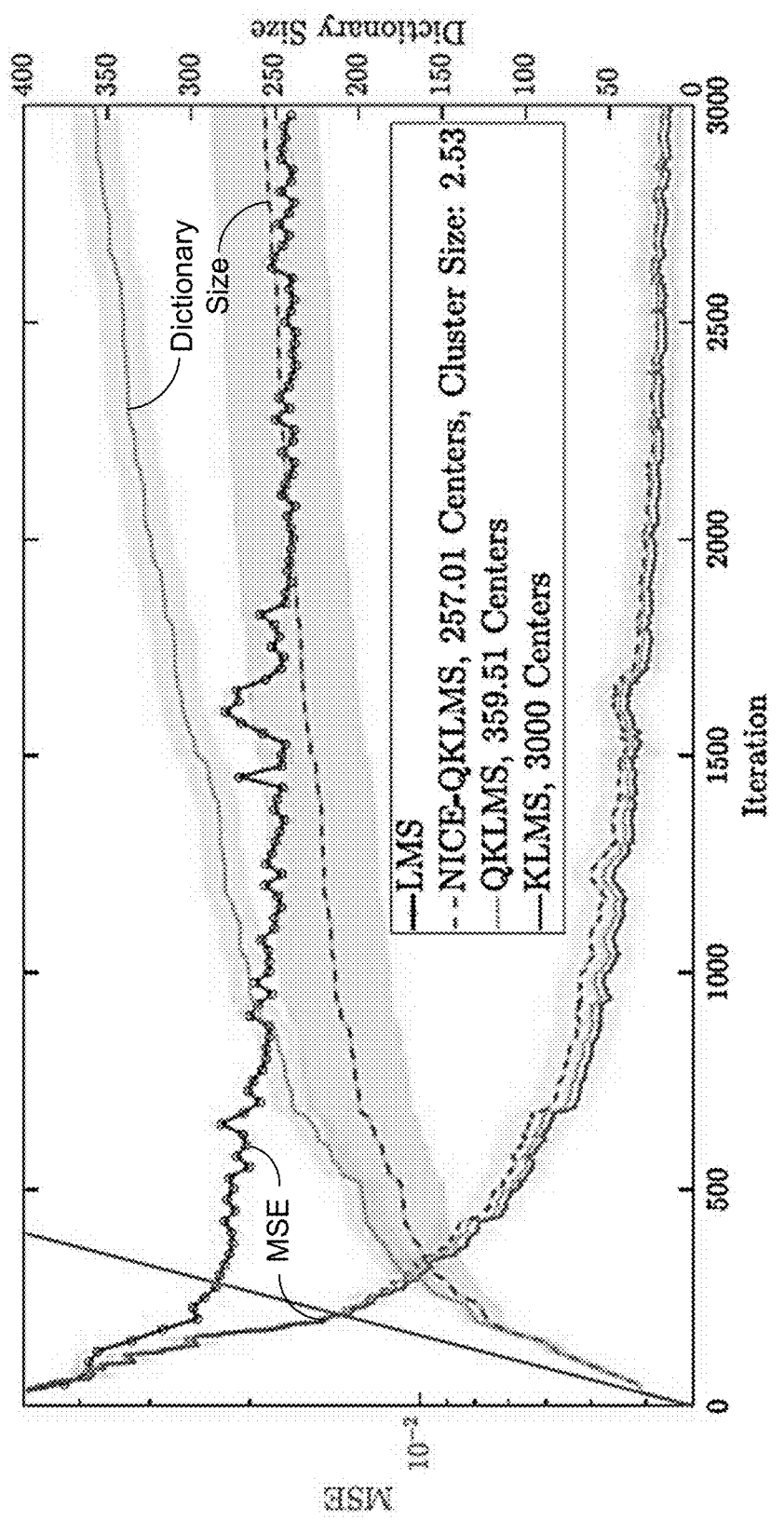
FIG. 5 illustrates an example of the average NICE-KLMS performance over 100 independent trials, in accordance with various embodiments of the present disclosure.

Independent trials were run for 100 Monte Carlo simulations, in which training consisted of the same 3000 consecutive samples but with noise re-sampled from the same distribution, and testing consisted of 400 independent consecutive samples with re-sampled noise and random starting index. FIG. 5 shows the averaged test performance with ±1 standard deviation shaded on a two y-axes plot. The y-axis on the left side measures the average MSE of the learning curves for the LMS, KLMS, QKLMS, and NICE-QKLMS algorithms, which starts from the upper-left corner. The y-axis on the right side measures the average network or dictionary size for the four algorithms, which starts from the lower-left corner or origin. In the case of the NICE-QKLMS algorithm, the average dictionary size across clusters is used. As expected, the KAF algorithms outperformed LMS, converging to much smaller values of MSE, due to their nonlinear nature. It can be seen that NICE-QKLMS produced the same testing MSE at the final stage of the adaptation as QKLMS, but used a more parsimonious structure.

For this particular experimental setup, NICE-QKLMS network used more than 100 fewer centers (257.01 vs 359.51) than QKLMS after 3000 iterations. Left uncurbed, the KLMS grew linearly, with 3000 centers, after the same number of updates. The vector quantization algorithm in QKLMS bounds the center-to-center distances from below, sequentially merging nearby centers into existing centers. However, it lacks a mechanism to bound center-to-center distances from above. For a given input sample, many of the centers in the QKLMS dictionary are sufficiently far away for the output of the Gaussian reproducing kernel to produce significant contributions.

On the other hand, by partitioning the input/feature space into distinct spatial regions, NICE-QKLMS is able to specialize and provide better or similar performance using fewer samples per operation. The average number of clusters at the end of the adaptation was 2.53. On average, to evaluate the function approximate at each input, NICE-QKLMS automatically selected one of the 2.53 filters (with an average of 257 centers per filter) based on the minimum input-to-centroid distance threshold and performs KAF. For the same performance, the computational savings of NICE-QKLMS vs QKLMS is approximately 100 kernel evaluations, taking into account the 2.53 centroid distance computations used for filter selection.

Lorenz Time Series Prediction

Next, consider the Lorenz chaotic system described by the following three ordinary differential equations:

$$\begin{cases} \frac{dx}{dt} = -\sigma(y-x) \\ \frac{dy}{dt} = x(\rho-z) - y \\ \frac{dz}{dt} = -xy - \beta z \end{cases} \quad (45)$$

where $\sigma=10$, $$\beta = \frac{8}{3},$$

and ρ=28 are the parameters at which the system exhibits chaotic behavior. The Lorenz system is nonlinear and aperiodic. The x-component is used in the following short-term prediction task. The signal is normalized to be zero-mean and unit-variance.

Figure 6:
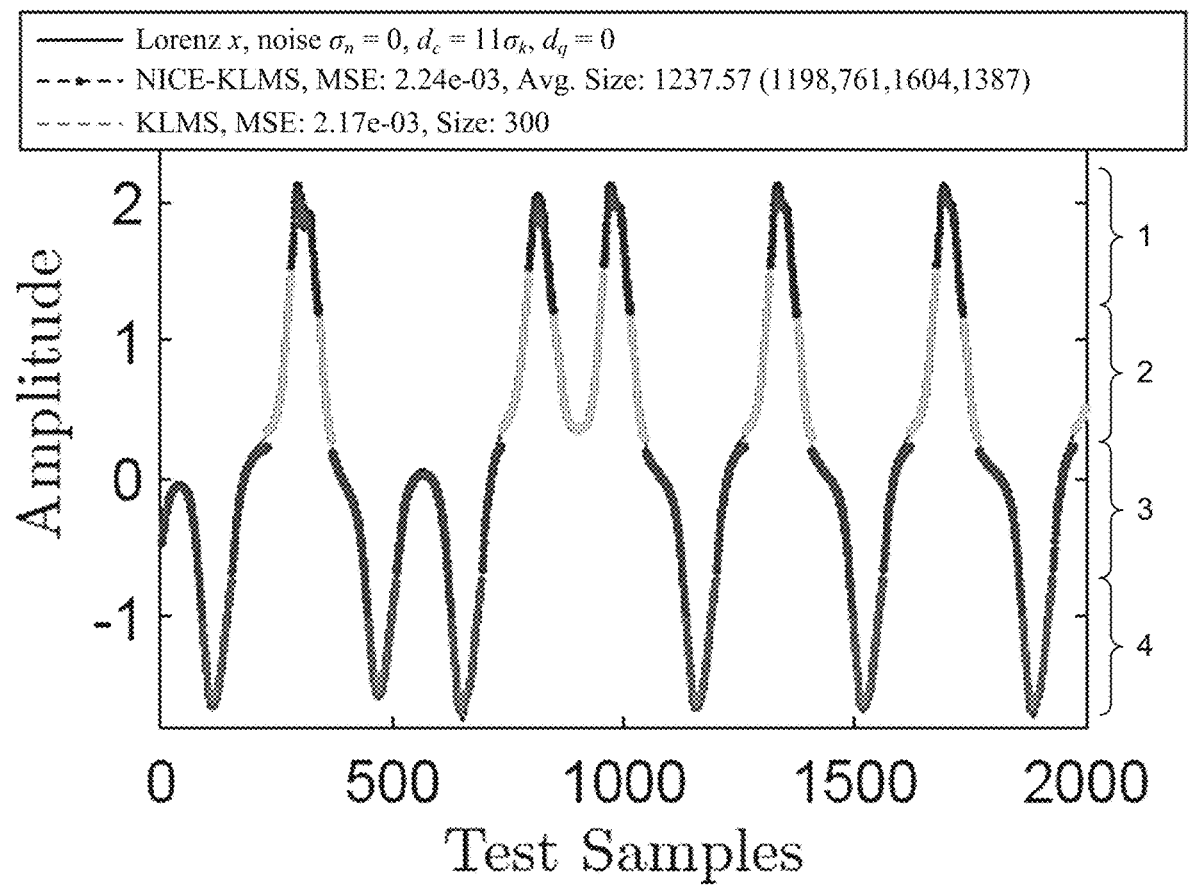
FIG. 6 illustrates a comparison of NICE-KLMS with KLMS on the clean x-component of the Lorenz chaotic time series prediction, in accordance with various embodiments of the present disclosure.

FIG. 6 compares NICE-KLMS with KLMS on the clean x-component of the Lorenz chaotic time series prediction. Data samples were self-organized into four spatial regions by the NICE-KLMS algorithm, which are approximately indicated on the right. The filter length was set at L=8; learning rate for both algorithms at η=0.1; kernel parameter at a=1; the centroid-distance threshold for NICE-QKLMS at $d_c=11\sigma_k$ with respect to the Gaussian kernel width. The training consisted of 3000 consecutive samples; and the testing of 2000 independent consecutive samples. Without noise distortion, it can be clearly seen that the spatial regions self-organized by NICE-KLMS, in four color-coded clusters. The NICE-KLMS achieved comparable testing performance as KLMS (MSE of $2.24 \times 10^{-3}$ vs $2.17 \times 10^{-3}$), but used significantly fewer centers per evaluation (average final cluster size of 1237.5 vs 3000).

For a more comprehensive comparison between the NICE-(Q)KLMS and (Q)KLMS algorithms, their performances (prediction gain and per-evaluation network size) were visualized using 3D surface plots as illustrated in FIGS. 7A-7F, which include the prediction gain plot (left) for NICE-(Q)KLMS (full-color surface) and (Q)KLMS (translucent mesh), side-profile (center) of the performance surfaces, and the RBF network size (right). The prediction gain was used as the quantitative predictive performance measure, defined by:

$$R_P \triangleq 10\log_{10}\frac{\sigma_u^2}{\sigma_e^2}(\text{dB}), \tag{46}$$

where $\sigma_u^2$ is the signal power and $\sigma_e^2$ is the MSE. Each of the six subplots corresponds to the KAF performances using a different vector quantization threshold: $d_c=0$ in FIG. 7A; $d_c=0.05$ in FIG. 7B; $d_c=0.1$ in FIG. 7C; $d_c=0.2$ in FIG. 7D; $d_c=0.3$ in FIG. 7E; and $d_c=0.4$ in FIG. 7F. The learning rate was fixed at η=0.1, and the kernel parameter at a=1.

Within each subplot of FIGS. 7A-7F, the first (or left) mini graph is the prediction gain surface plot of the NICE-(Q)KLMS algorithm with its (Q)KLMS counterpart. The x-axis denotes the filter length, ranging from 1 to 15 in unit increments. The y-axis denotes the centroid-distance threshold in multiple of $\sigma_k$ with respect to the Gaussian kernel width, ranging from 1 to 15 in unit-$\sigma_k$ increments. The z-axis measures the prediction gain in dB and color-mapped with respect to magnitude. The performance surfaces of the NICE family of KAF algorithms are rendered using opaque colors, while the surfaces of the original KAF algorithms are rendered using translucent mesh. Since the (Q)KLMS performance is invariant with respect to the centroid-distance threshold, a side-profile of the performance surface is shown in the second (or middle) mini graph of each subplot. The (Q)KLMS performance is shown using a solid color-mapped line, against the semitransparent surface background, corresponding to all the achievable performance regions of their NICE counterparts superimposed or layered for each centroid-distance threshold. The third (or right) mini graph of each subplot shows the final per-evaluation dictionary sizes used by each algorithm to achieve the corresponding prediction gains. Again, a side-profile is used for clarity, since the (Q)KLMS algorithms are invariant with respect to the centroid-distance thresholds. Their RBF structure size appears as a single line, while the NICE RBF network sizes are layered surfaces with respect to the centroid distances. The NICE subfilter size is proportional to the centroid-distance threshold: The upper-limit on the layered surface corresponds to the largest threshold ($15 \times \sigma_k$), i.e., more inclusive; and the lower-limit, the smallest ($1 \times \sigma_k$).

Figure 7A:
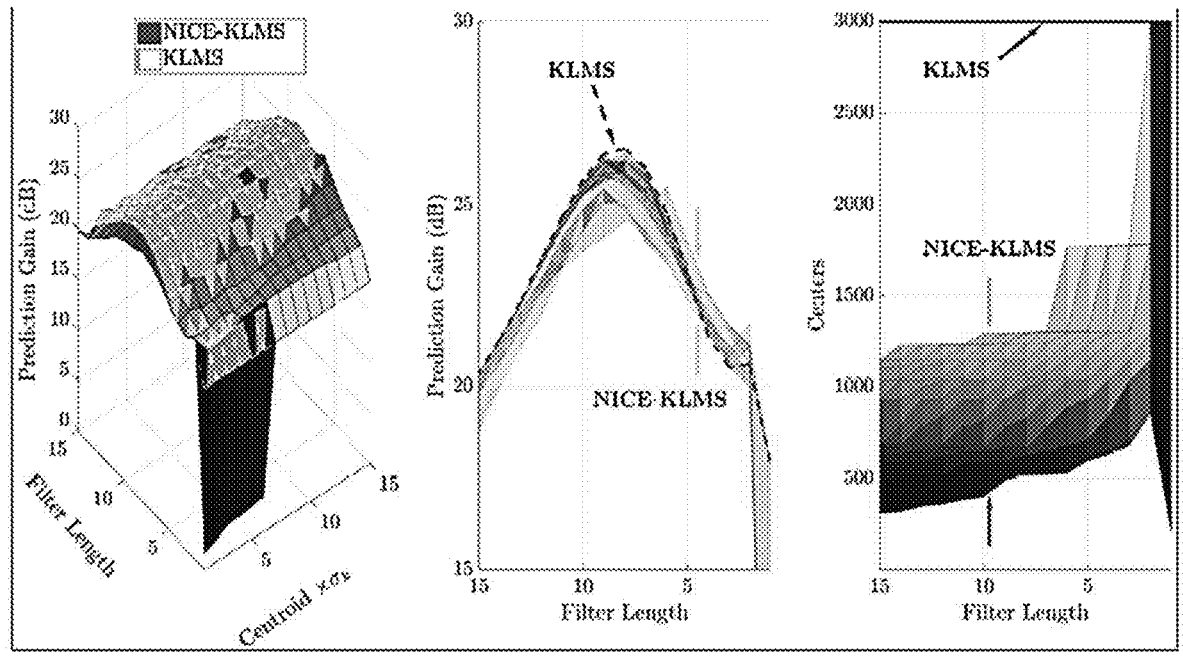
FIGS. 7A-7F illustrate prediction gain and per-evaluation network size for the NICE-(Q)KLMS and corresponding (Q)KLMS algorithms with various quantization threshold values, in accordance with various embodiments of the present disclosure.
Figure 7B:
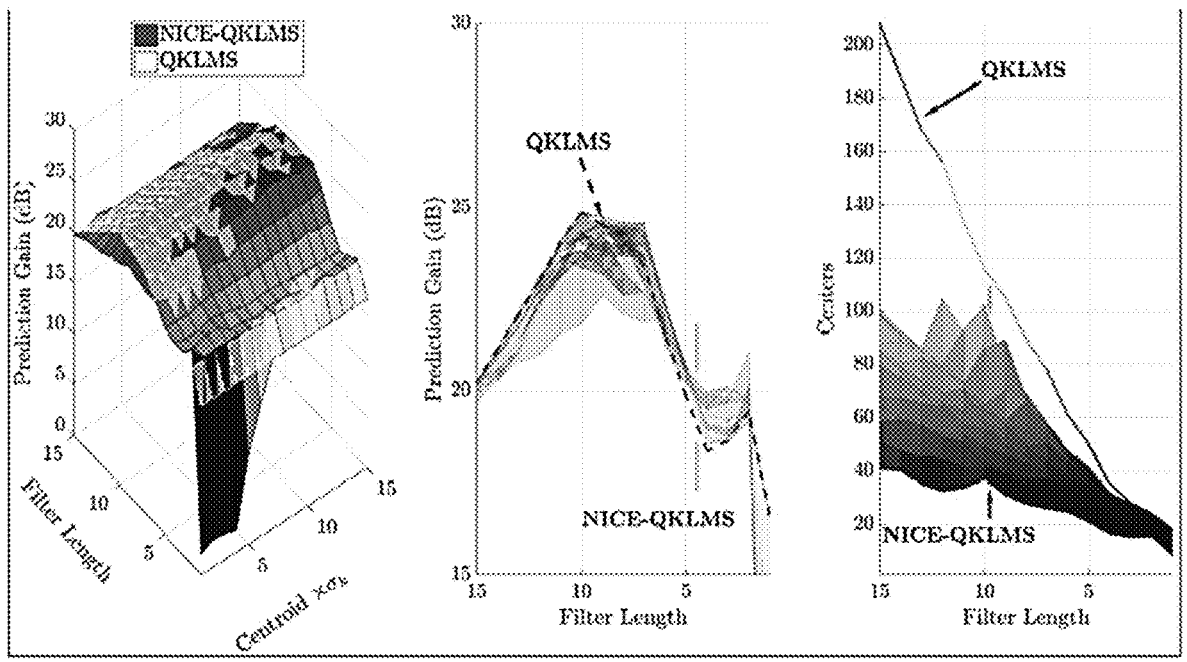
Figure 7C:
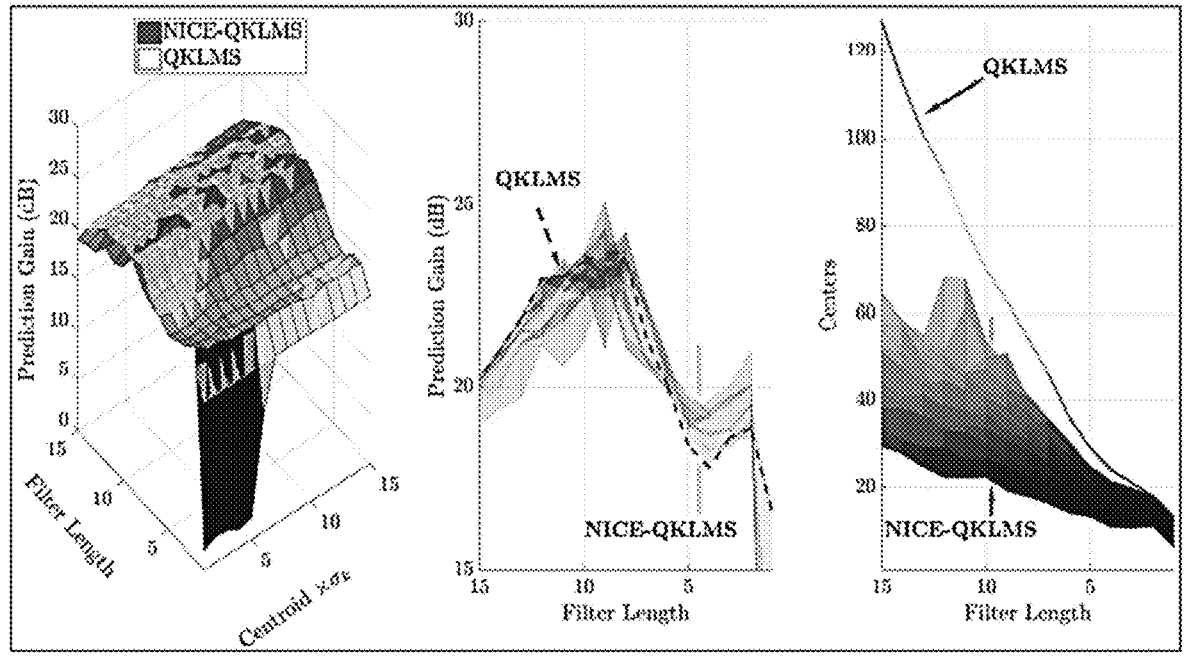
Figure 7D:
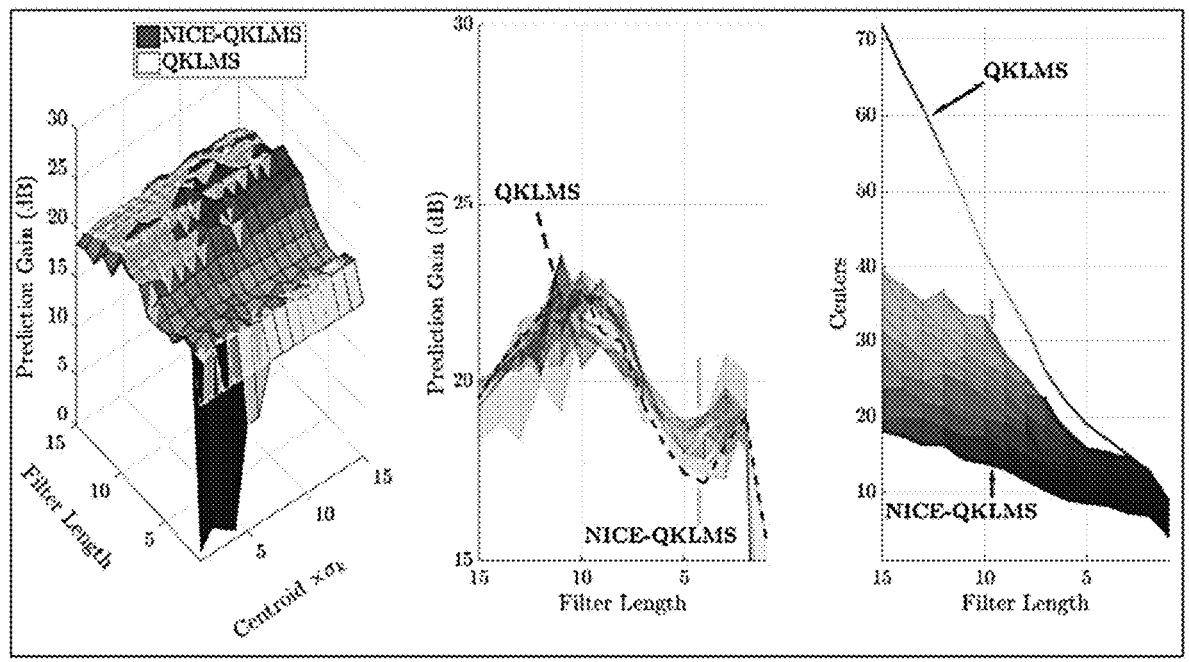
Figure 7E:
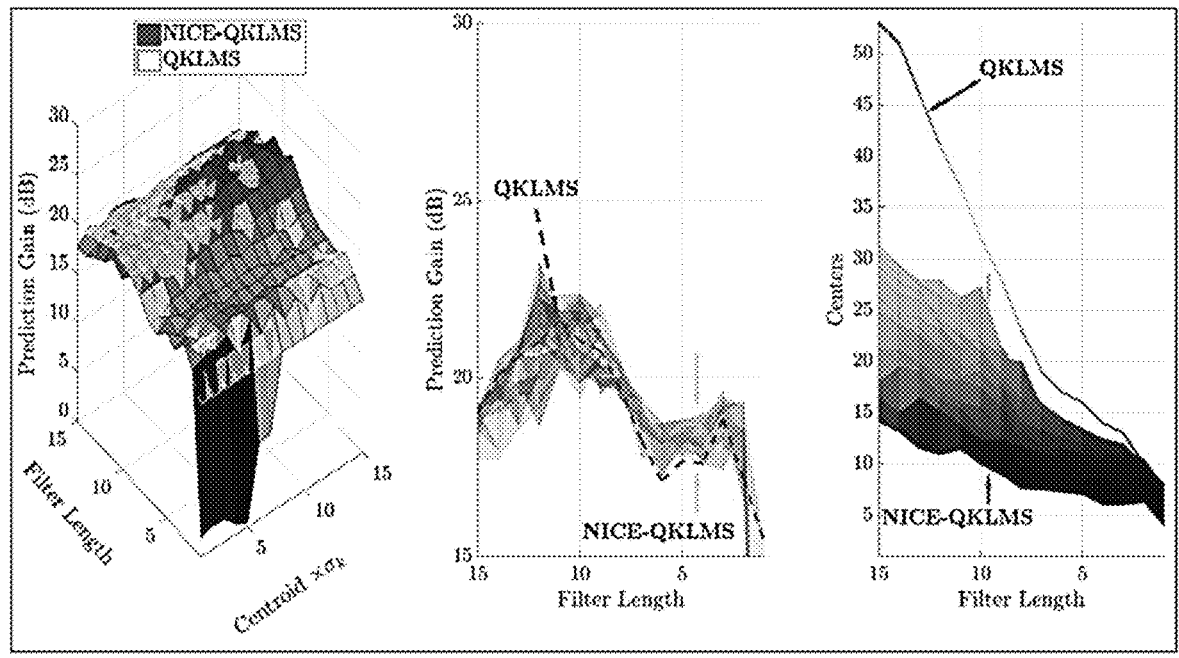
Figure 7F:
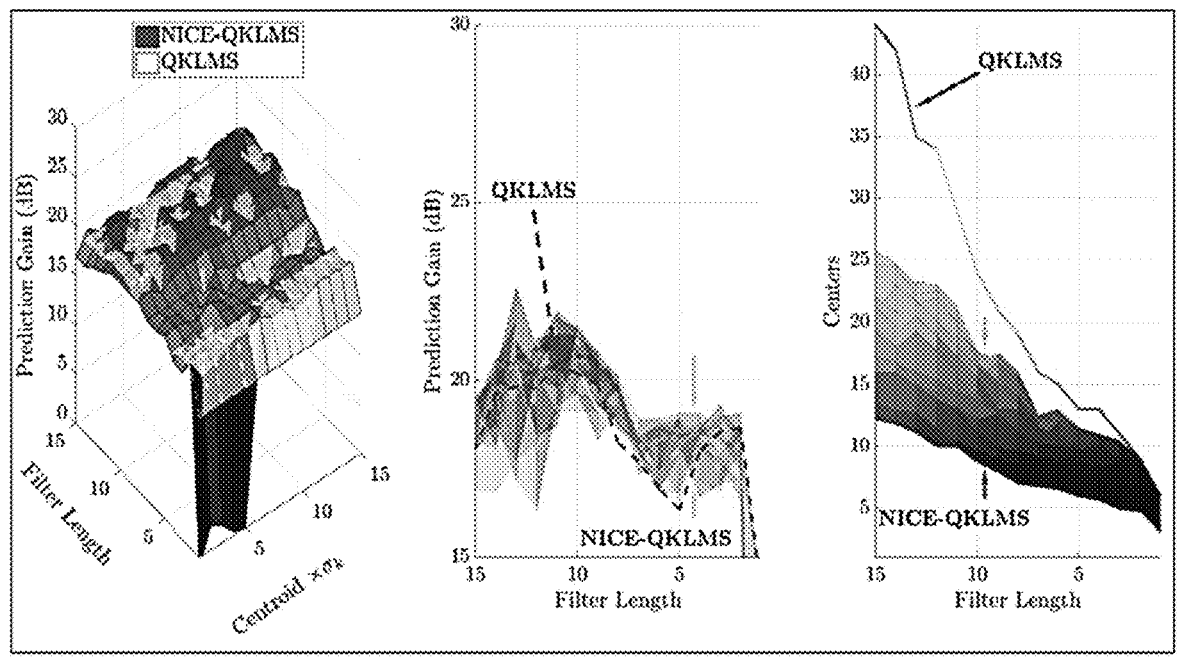

As expected, the best performance is achieve when the quantization threshold is at zero, in FIG. 7A, with a best filter length of L=8. The KLMS performance serves as an upperbound for most of the design parameter pairs, although the NICE-KLMS performance is very competitive (26.41 dB vs 26.54 dB) using roughly a third of the centers. For non-zero quantization thresholds, we see that there exists an operating point for which the NICE-QKLMS outperforms the QKLMS algorithm using fewer centers per evaluation. The results are tabulated in the table of FIG. 8.

Transfer Learning Using Content Addressable Filter Bank (CAFB)

Under the NICE framework, partial functionals comprising the adaptive filter can be quickly stored and retrieved based on the input pattern. Instead of frequency bands, the subfilters are organized by amplitude or spatial bands or patterns. Since each cluster or distinct quasi-orthogonal region corresponds to a specialized "spatial-band" subfilter, the filter evaluation becomes the update of one of the partial filters, creating a content addressable filter bank or associative filter storage. This CAFB can be incrementally updated for new signal applications with mild constraints (e.g., amplitude normalization and same embedding dimension), opening the door for transfer learning and significantly more efficient training for new data scenarios, avoiding large initial errors produced by training from scratch, as have been done since the invention of adaptive filtering, and leverage previously learned knowledge to enhance prediction on limited data.

Here, the multipurpose capability of the NICE algorithm can be demonstrated by showing that each subfilter can be shared across different signals. Specifically, it can be shown that a NICE CAFB trained on one chaotic time series (Mackey-Glass) can be quickly repurposed for another time series (Lorenz), and one trained on the Lorenz time series can be transferred to enhance the performance of the real-world sunspot one-step-ahead prediction task. This is expected to be the case for other applications where a model for the time series is required but the number of labeled data is limited.

Figures 8, 9:
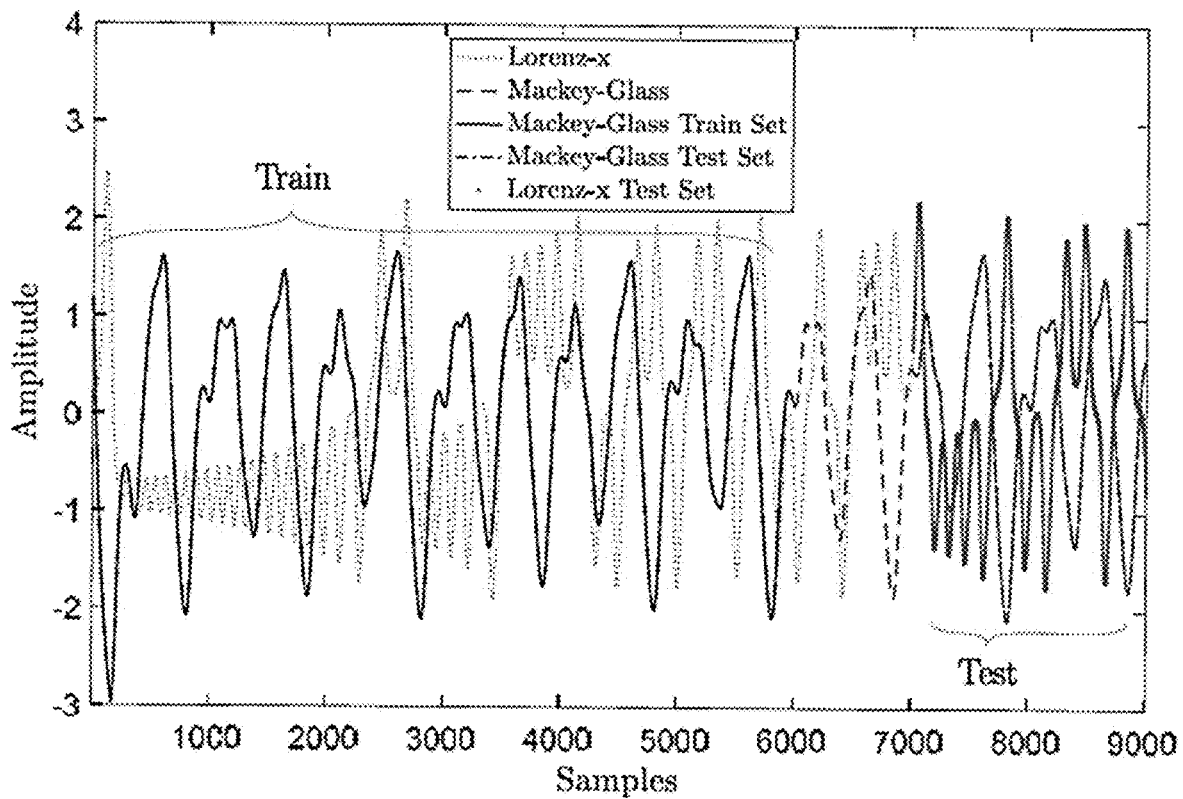
FIG. 8 is a table including a summary of prediction gain performances, in accordance with various embodiments of the present disclosure.
FIG. 9 illustrates an example of data used for a content addressable filter bank demonstration, in accordance with various embodiments of the present disclosure.

(1) Chaotic Time Series Prediction:

FIG. 9 shows the data (zero-mean, unit variance) used for training and testing purposes. The data used for the CAFB demonstration consist of two distinct chaotic time series: Mackey-Glass (MG) and Lorenz x-component. The first 6000 samples of the MG chaotic time series (β=0.2, γ=0.1, τ=17, initial condition $x_0=1.2$, and time step $\Delta_t=0.1$) were used to train a NICE-QKLMS filter (filter length L=12, learning rate η=0.1, kernel parameter a=1, quantization threshold $d_q=0.01$, and centroid distance threshold $d_c=6\sigma_k=4.2426$). Testing consisted of 2000 consecutive samples, 1000 samples in the future, as shown in FIG. 9. The trained NICEQKLMS filter was tested on both Mackey-Glass and a totally different chaotic time series, the Lorenz x-component. The Lorenz chaotic time series was generated using MATLAB's ordinary differential equation (ODE) solver ode45 in the time interval T=[0,50] with variable step size, σ=10, $$\beta = \frac{8}{3},$$

and ρ=28, initial condition $(x_0, y_0, z_0)=(0,1,1.05)$.

Figure 10:
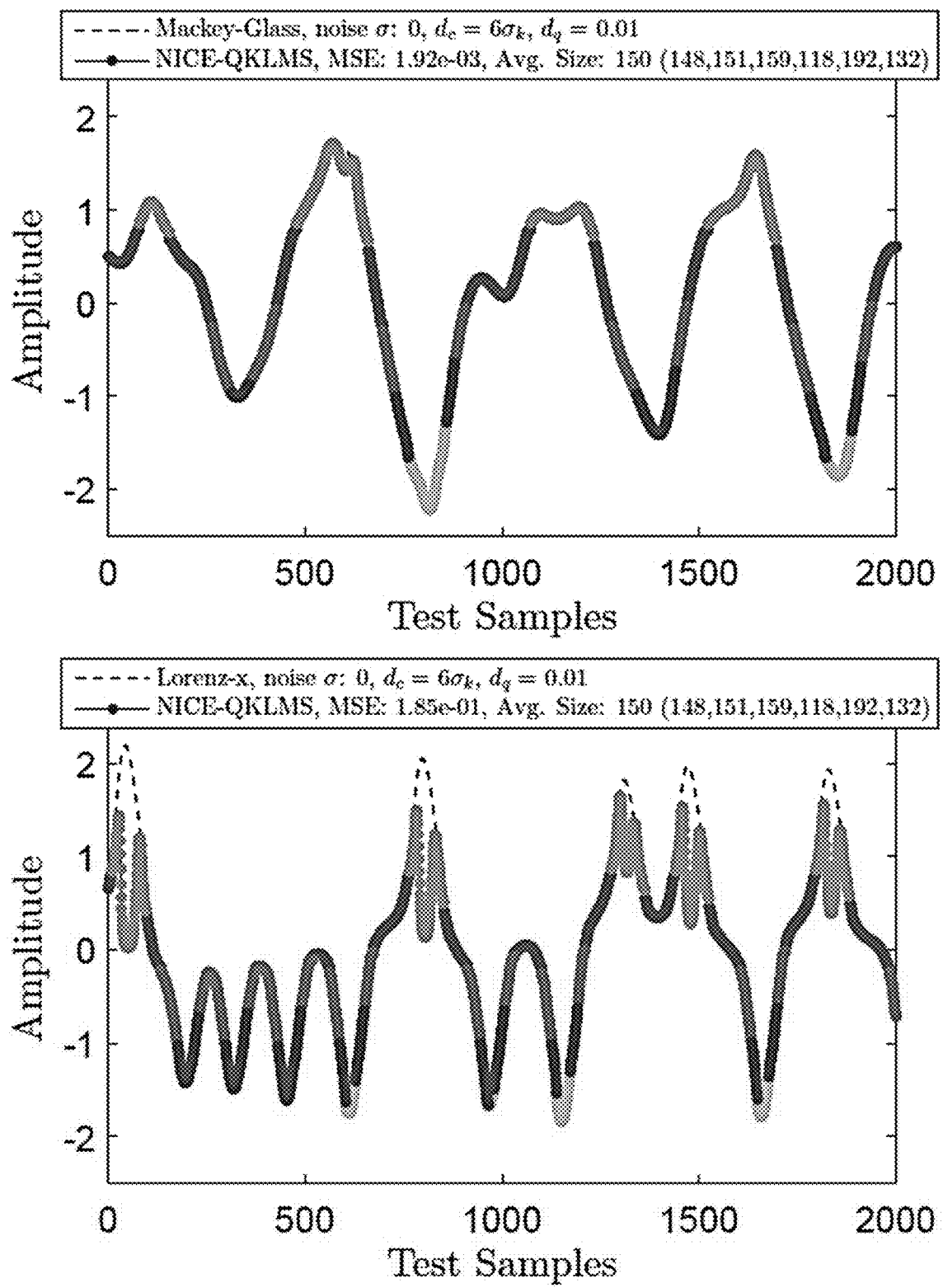
FIGS. 10 and 11 illustrate examples of Lorenz chaotic time series prediction using NICE filter, in accordance with various embodiments of the present disclosure.

FIG. 10 shows an example of the Lorenz chaotic time series prediction using NICE filter trained on Mackey-Glass. The top plot of FIG. 10 shows the test performance of the MG-trained NICE-QKLMS filter on the MG test set. It can be seen that NICE organized the data points into six distinct color-coded regions (only five were automatically selected for this particular test set), with an average of 150 centers representing each region (compared to 6000 centers for normal KLMS operation). The bottom graph of FIG. 10 shows the MG-trained NICE-QKLMS performance on the Lorenz x-component test set. Although the filter had never seen this chaotic time series before, and they have different time scales, it was able to represent shared local structures using the same color-coded clusters. The performance degradation, from an MSE of 1.92e−3 to 1.85e−1, may be attributed to the filter's inability to represent the high peaks of the Lorenz time series. Although both time series are zero-mean and unit-variance, it can be seen from FIG. 9 that the dynamic range of the two are slightly shifted: the Lorenz series has higher peaks than the MG, while a typical MG peak dips in the middle and has lower troughs.

NICE self-organizes the data into interchangeable local components that can be used for different signals. To further illustrate its multipurpose capability, the MG-trained filter was adapted using the Lorenz data to show that it's faster to train than from scratch. NICE provides fast, native support for automatically isolating and identifying a problem region. In the example, the Lorenz data contained new sample points (higher narrower peaks) that are not represented in the MG training data. Rather than updating the entire filter, NICE was only allowed to automatically create/split and update a single new cluster, using the exact same centroid parameters as before.

Figure 11:
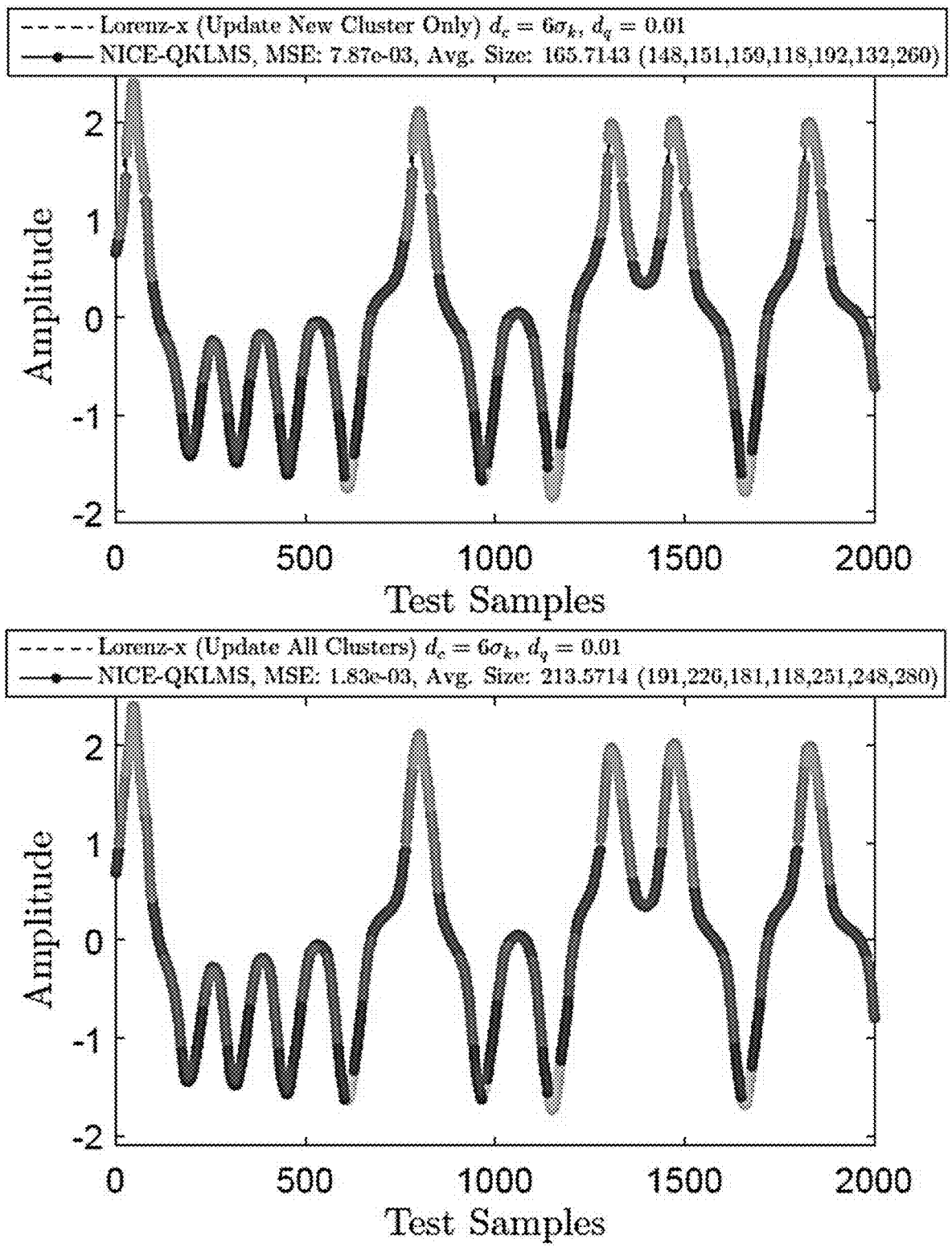

FIG. 11 shows an example of the Lorenz chaotic time series prediction using updated NICE filters initially trained on MG. The top plot of FIG. 11 shows the performance of this updated NICE-QKLMS algorithm by updating new clusters only (Split & Retain followed by update procedures on the new clusters only). A new color-coded cluster has been automatically introduced to accommodate for the peculiar time structure of Lorenz. The coefficients and centers of the existing clusters are completely unchanged. By running through the Lorenz training data and only updating the centers and coefficients of new clusters, i.e., only the Split & Retain operation was allowed, followed by update procedures on just the new clusters, the test-set performance improved from an MSE of 1.85e−1 to 7.87e−3 with an average increase of 15.7 centers per cluster. When all clusters (old and new) were allowed to adapt to the new data, i.e., all three operations can be performed at any given point, an MSE of 1.83e−3 was obtained with 63.6 additional centers per cluster, as shown in the bottom plot of FIG. 11. To gain more individual control, we can judiciously select the clusters to adapt, by computing sensitivities and allowing adaptation on clusters with certain high values.

Figure 12:
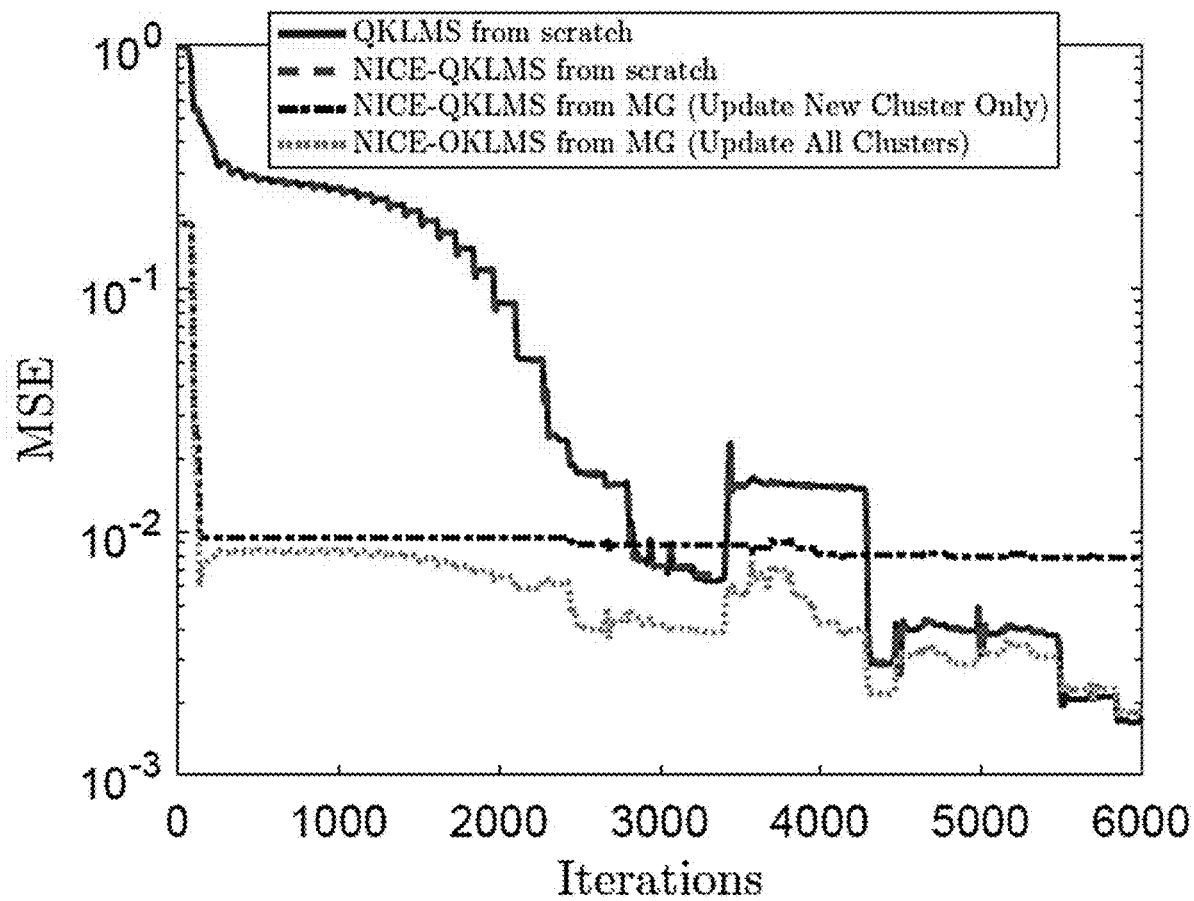
FIG. 12 illustrates learning curve comparisons of Lorenz chaotic time series prediction using updated NICE filters, in accordance with various embodiments of the present disclosure.

Finally, the learning curves of the updated filters (Lorenz chaotic time series prediction using updated NICE filters initially trained on MG) were compared to the learning curves of filters learned from scratch, as shown in FIG. 12. By starting from an existing filter trained on a completely different chaotic time series, NICE-QKLMS adapted extremely rapidly in the new data environment and generated a head-start of more than 5000 iterations. This demonstrates the multipurpose capability of the NICE CAFB formulation.

Figure 13:
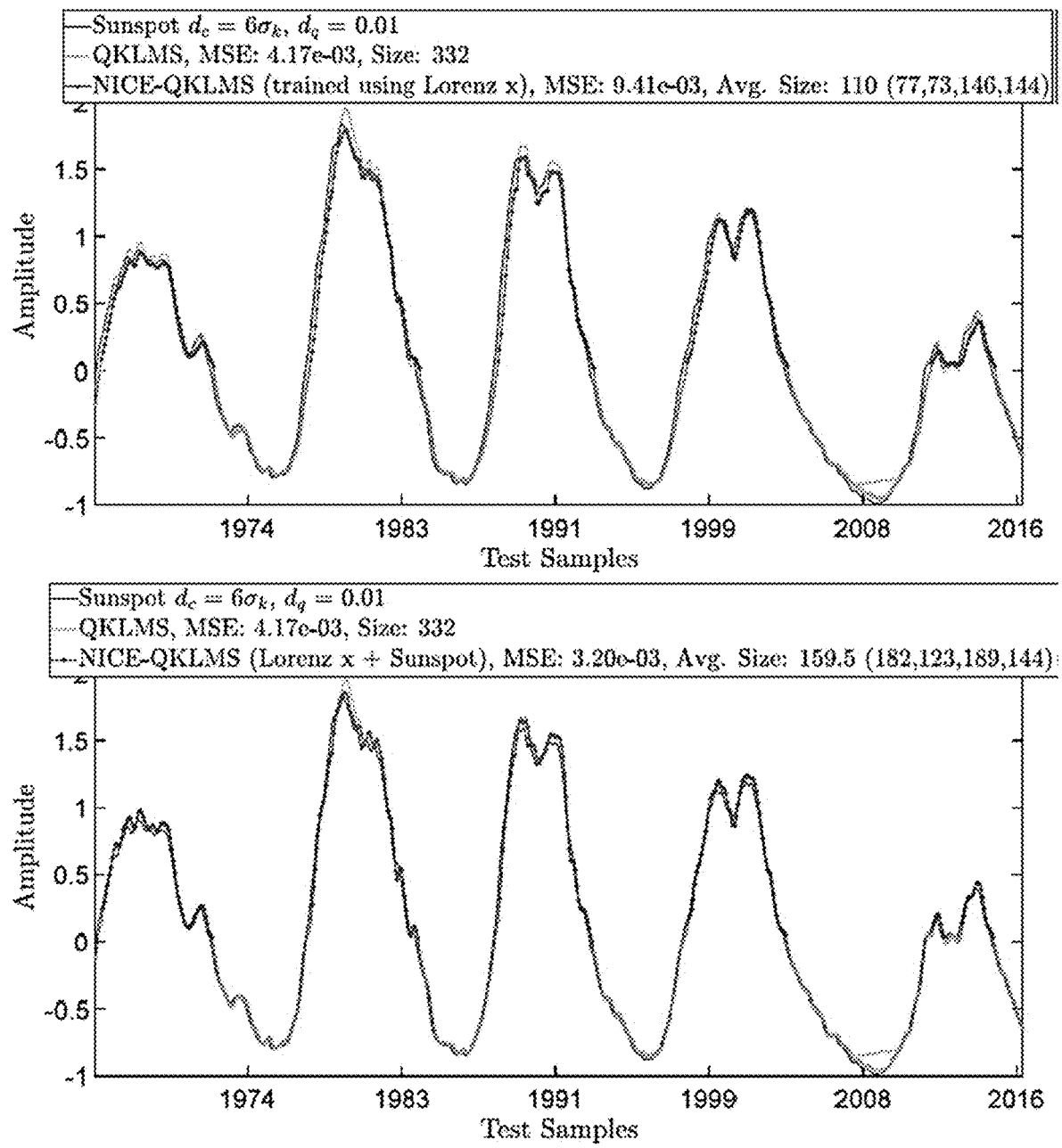
FIG. 13 illustrate examples of test set performances of 13-month smoothed monthly total sunspot numbers time series, in accordance with various embodiments of the present disclosure.

(2) Sunspot Prediction:

FIG. 13 shows test set performances of the 13-month smoothed monthly total sunspot numbers time series from 1749 to 2016. The top plot illustrates the CAFB performance trained completely on the Lorenz time series. The bottom plot illustrates the updated test performance after adaptation on the sunspot training set. The color-coding shows the "spatial-band" or subfilter used for each NICEQKLMS prediction.

The first 6000 samples of the Lorenz chaotic time series in FIG. 9 were used to train a NICEQKLMS filter (filter length L=5, learning rate η=0.05, kernel parameter a=1, quantization threshold $d_q$=0.01, and centroid distance threshold $d_c$=6$\sigma_k$=4.2426). The time series was normalized to zero-mean with unit variance. Furthermore, the dynamic range of the sunspot time series was made the same as the Lorenz x-component's, using the ratio of their maximum absolute values. Sunspot numbers from July 1749 to February 1966 were used for training, and testing utilized sunspots from August 1966 to November 2016.

Figure 14:
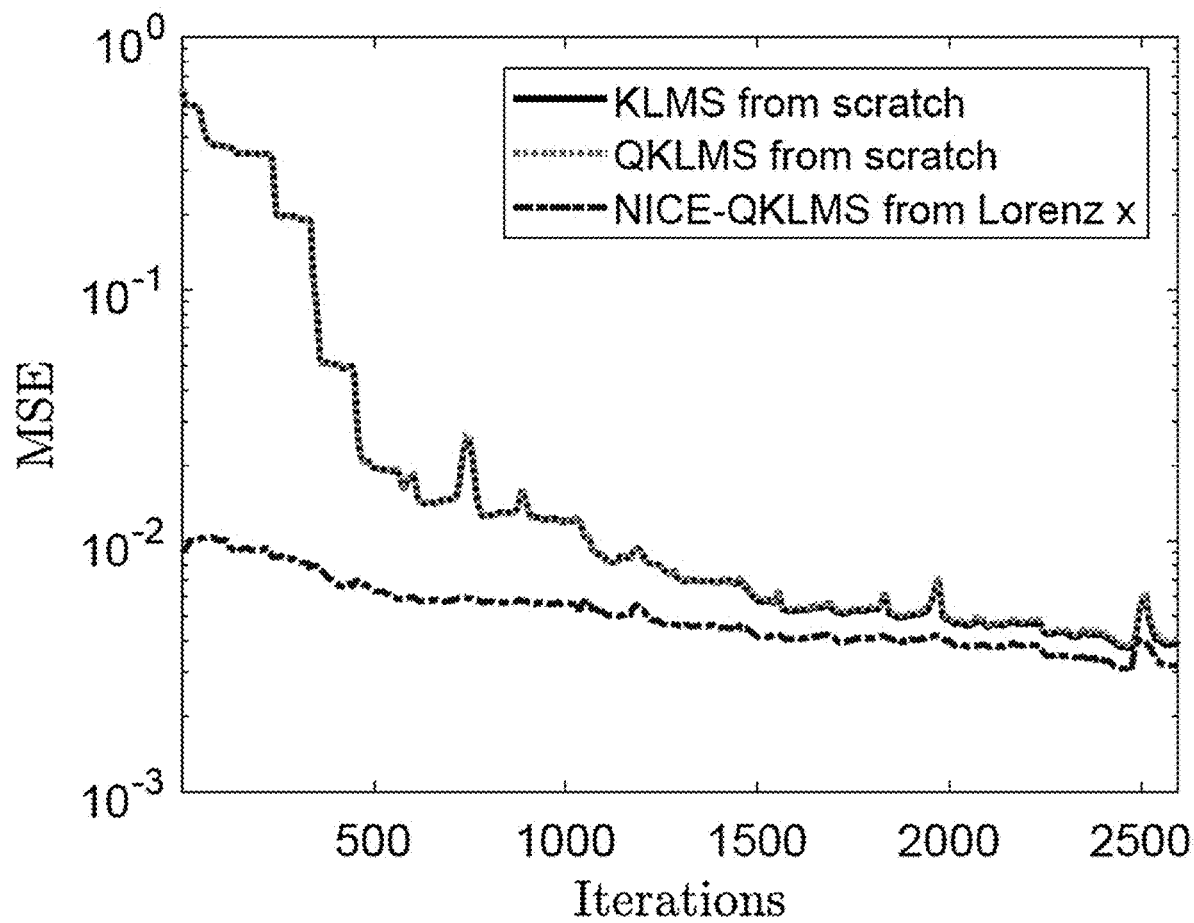
FIG. 14 illustrates learning curve comparisons of sunspot prediction using updated NICE CAFB initially trained on Lorenz time series, in accordance with various embodiments of the present disclosure.

The top subplot of FIG. 13 shows the sunspot test set performance of the NICE-QKLMS CAFB trained using only the Lorenz time series, and compared with a QKLMS filter trained from scratch on the sunspot time series. The CAFB produced comparable performance even though it was trained on a completely different time series and, on average, used one third of the centers in a QKLMS implementation. If the CAFB is allowed to adapt using the new training data, a superior test set performance can be obtained than QKLMS (MSE of 3.20e−3 vs. 4.17e−3) with approximately a 50% saving in computation (average center size of 159.5 vs 332), as shown in the bottom subplot of FIG. 13. The KLMS, QKLMS, and NICE-QKLMS learning curves are plotted in FIG. 14. The learning curves of FIG. 14 compares the sunspot prediction using the updated NICE CAFB initially trained on the Lorenz time series. It can be seen that CAFB was able to leverage previously learned local structures to outperform filters trained from scratch with a greater efficiency. This opens the door for similar problems where the knowledge learned from an abundantly available synthetic data can be transferred to a target task with limited measurements.

Figure 15:
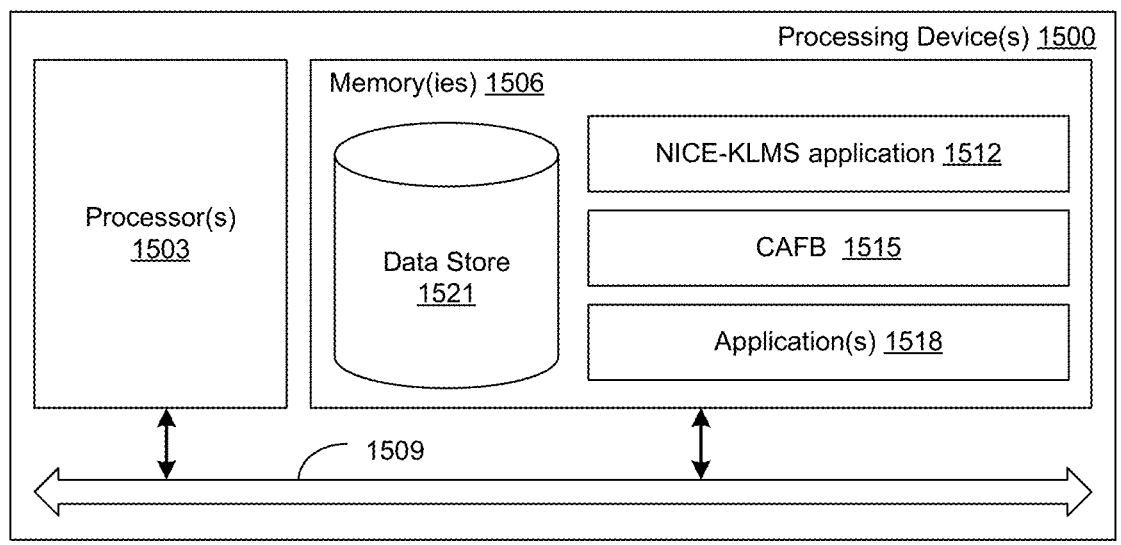
FIG. 15 is a schematic block diagram of an example of a processing device, in accordance with various embodiments of the present disclosure.

With reference now to FIG. 15, shown is a schematic block diagram of a processing device 1500 according to an embodiment of the present disclosure. The processing device 1500 includes at least one processor circuit, for example, having a processor 1503 and a memory 1506, both of which are coupled to a local interface 1509. To this end, the processing device 1500 may comprise, for example, at least one server, computer or like computing device. The local interface 1509 may comprise, for example, a data bus with an accompanying address/control bus or other bus structure as can be appreciated.

Stored in the memory 1506 are both data and several components that are executable by the processor 1503. In particular, stored in the memory 1506 and executable by the processor 1503 are a NICE-KLMS application 1512, one or more CAFB 1515 that may be used for object recognition, and potentially other applications 1518. Also stored in the memory 1506 may be a data store 1521 including, e.g., images, video and other data. In addition, an operating system may be stored in the memory 1506 and executable by the processor 1503. It is understood that there may be other applications that are stored in the memory and are executable by the processor 1503 as can be appreciated.

Where any component discussed herein is implemented in the form of software, any one of a number of programming languages may be employed such as, for example, C, C++, C#, Objective C, Java®, JavaScript®, Perl, PHP, Visual Basic®, Python®, Ruby, Delphi®, Flash®, or other programming languages. A number of software components are stored in the memory and are executable by the processor 1503. In this respect, the term "executable" means a program file that is in a form that can ultimately be run by the processor 1503. Examples of executable programs may be, for example, a compiled program that can be translated into machine code in a format that can be loaded into a random access portion of the memory 1506 and run by the processor 1503, source code that may be expressed in proper format such as object code that is capable of being loaded into a random access portion of the memory 1506 and executed by the processor 1503, or source code that may be interpreted by another executable program to generate instructions in a random access portion of the memory 1506 to be executed by the processor 1503, etc. An executable program may be stored in any portion or component of the memory including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory is defined herein as including both volatile and nonvolatile memory and data storage components. Volatile components are those that do not retain data values upon loss of power. Nonvolatile components are those that retain data upon a loss of power. Thus, the memory 1506 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 1503 may represent multiple processors 1503 and the memory 1506 may represent multiple memories 1506 that operate in parallel processing circuits, respectively. In such a case, the local interface 1509 may be an appropriate network that facilitates communication between any two of the multiple processors 1503, between any processor 1503 and any of the memories 1506, or between any two of the memories 1506, etc. The processor 1503 may be of electrical or of some other available construction.

Although portions of the NICE-KLMS application 1512, CAFB 1515, and other various systems described herein may be embodied in software or code executed by general purpose hardware, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The NICE-KLMS application 1512 and CAFB 1515 can comprise program instructions to implement logical function(s) and/or operations of the system. The program instructions may be embodied in the form of source code that comprises human-readable statements written in a programming language or machine code that comprises numerical instructions recognizable by a suitable execution system such as a processor 703/803 in a computer system or other system. The machine code may be converted from the source code, etc. If embodied in hardware, each block may represent a circuit or a number of interconnected circuits to implement the specified logical function(s).

Also, any logic or application described herein, including the NICE-KLMS application 1512 and CAFB 1515 that comprises software or code can be embodied in any non-transitory computer-readable medium for use by or in connection with an instruction execution system such as, for example, a processor 1503 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

In this disclosure, a novel online nearest-neighbors approach to organize and curb the growth of the radial basis function (RBF) structure in kernel adaptive filtering (KAF) algorithms is presented. The nearest-instance-centroid-estimation (NICE) kernel least-mean-square (KLMS) algorithm is an instance-based learning that provides the appropriate time-space tradeoff with good online performance. Its centers or support vectors in the input/feature space form self-organized regions. The need to maintain complex search data structures is traded for a depth-1 forest with the iteratively updated centroid of each cluster at the root. A linear search among the centroids determines the subset of local supports or subfilter used to evaluate a given function approximation. Compared to the popular RBF network reduction algorithm used in quantized KLMS, which only bounds the network structure or center-to-center distances from below, NICE bounds the network structure from above, by relocating centers outside of a certain responsive domain to a different subfilter. Using the energy conservation relation for adaptive filtering, the sufficient condition for mean square convergence of the NICE-KLMS algorithm was shown. The upper and lower steady-state excess-mean-square-error (EMSE) bounds were also established. As a proof-of-concept, vector quantization (VQ) was combined with NICE to formulate the novel KAF algorithm. Simulations on chaotic time-series prediction tasks demonstrated that the proposed method outperforms existing vector quantization method using fewer centers per evaluation. Furthermore, the multipurpose capability of the novel approach was demonstrated by performing regression on different signals using the same content addressable filter bank (CAFB) or associative filter storage. Nice CAFB can leverage previously learned knowledge to a related task or domain.

A novel approach for cluster analysis or unsupervised learning within the kernel adaptive filtering framework for regression was presented. By self-organizing the data centers into distinct spatial regions, and with NICE's ability to detect changes in data distribution, non-stationary learning systems are possible. As a CAFB, universal filtering of different signals. The NICE framework is also closely related to multiple and mixture kernel learning, but formulated within a single fixed RKHS. Enhanced versions can be developed using different kernel parameters, introducing adaptive learning parameters, and applying the associative filter storage to multiple tasks.

A novel nearest-neighbors approach to organize and curb the growth of radial basis function (RBF) structure in kernel adaptive filtering (KAF) has been discussed. The nearest-instance-centroid-estimation (NICE) kernel least-mean-square (KLMS) algorithm provides an appropriate time-space trade-off with good online performance. Its centers in the input/feature space form self-organized regions. Compared with conventional KAF, instead of using all centers to evaluate/update the function approximation at a given point, a linear search among the iteratively-updated centroids determines the set of local supports used, naturally forming a locally-supported reproducing kernel. NICE is complementary to existing RBF network reduction algorithms. Under the NICE framework, information is quickly stored and retrieved based on its content. Since each cluster corresponds to a specialized spatial-band filter, it becomes a content addressable filter bank (CAFB). This CAFB can be incrementally updated for new applications, always using the past-learned filters, allowing for transfer learning and significantly more efficient training for new data scenarios, avoiding training from scratch as have been done since the beginning of adaptive filtering.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A system, comprising:
   processing circuitry including a processor, the processing circuitry configured to;
     organize data received by the system into clusters or quasi-orthogonal regions, where the clusters or quasi-orthogonal regions are organized based upon a centroid threshold distance, where the data received by the system corresponds to a first application and a received data point is organized by applying a cluster and retain operation, a cluster and merge operation or a split and retain operation;
     determine filter weights based at least in part upon centroids of the clusters;
     update a content addressable filter bank (CAFB) based upon the filter weights, where the CAFB was previously updated based upon data corresponding to a second application different from the first application; and
     filter subsequently received data based upon the CAFB.

2. The system of claim 1, wherein a clustering operation of the cluster and retain operation is applied to a quantized space of data samples.

3. The system of claim 1, wherein the cluster and merge operation comprises merging the received data point with an existing data point of a cluster when a minimum centroid distance for the received data point is less than the centroid threshold distance, and a minimum quantization distance for the received data point and the existing data point is less than a predefined quantization threshold.

4. The system of claim 1, wherein the split and retain operation comprises identifying a new cluster including the received data point when a minimum centroid distance for the received data point is greater than the centroid threshold distance.

5. The system of claim 1, wherein the data corresponding to the first application has a same embedding dimension as the data corresponding to the second application.

6. The system of claim 1, wherein the data corresponding to the first application is amplitude normalized with respect to the data corresponding to the second application.

7. A system, comprising:
   processing circuitry including a processor, the processing circuitry configured to:
     organize data received by the system into clusters or quasi-orthogonal regions, where the clusters or quasi-orthogonal regions are organized based upon a centroid threshold distance, where a received data point is organized by applying a cluster and retain operation, a cluster and merge operation or a split and retain operation;

determine filter weights based at least in part upon centroids of the clusters;

update a content addressable filter bank (CAFB) based upon the filter weights; and filter subsequently received data based upon the CAFB, where the CAFB is incrementally and recursively updated.

8. The system of claim 7, wherein the processing circuitry is configured to:

update the filter weights based upon additional data subsequently received by the system, where the additional data is organized by applying the cluster and retain operation, the cluster and merge operation or the split and retain operation;

revise the filter weights based upon updated centroids of the clusters; and update the CAFB based upon the revised filter weights.

9. The system of claim 8, wherein the processing circuitry is configured to load initial filter weights from an external data store.

10. The system of claim 8, wherein the CAFB is updated with a new filter.

11. The system of claim 8, wherein the data received by the system is a first type of data and the additional data subsequently received by the system comprises a second type of data.

12. The system of claim 7, wherein the cluster and merge operation comprises merging the received data point with an existing data point of a cluster when a minimum centroid distance for the received data point is less than the centroid threshold distance, and a minimum quantization distance for the received data point is less than a predefined quantization threshold; and the split and retain operation comprises identifying a new cluster including the received data point when a minimum centroid distance for the received data point is greater than the centroid threshold distance.

13. A method to automatically compose a universal filter, comprising:

receiving, by processing circuitry, initial data;

organizing, by the processing circuitry, the initial data into clusters or quasi-orthogonal regions, where the clusters or quasi-orthogonal regions are organized based upon a centroid threshold distance, where a received data point is organized by selectively applying one of the group consisting of a cluster and retain operation, a cluster and merge operation, and a split and retain operation, wherein the cluster and retain operation adds the received data point to a cluster, the cluster and merge operation merges the received data point with an existing data point in the cluster and the split and retain operation identifies a new cluster, where the split and retain operation is applied in response to a comparison of a minimum centroid distance of the received data point to the centroid threshold distance, and one of the group consisting of the cluster and retain operation and the cluster and merge operation is applied in response to the comparison of the minimum centroid distance of the received data point to the centroid threshold distance and a comparison of a minimum quantization distance for the received data point to a predefined quantization threshold;

determining, by the processing circuitry, filter weights based at least in part upon centroids of the clusters;

updating, by the processing circuitry, a content addressable filter bank (CAFB) based upon the filter weights;

receiving, by the processing circuitry, subsequent data; and filtering, by the processing circuitry, the subsequent data based upon the CAFB.

14. The method of claim 13, wherein a clustering operation of the cluster and retain operation is applied to a quantized space of data samples.

15. The method of claim 13, wherein the cluster and merge operation comprises merging the received data point with an existing data point of the cluster when the minimum centroid distance for the received data point is less than the centroid threshold distance, and the minimum quantization distance for the received data point and the existing data point is less than the predefined quantization threshold.

16. The method of claim 13, wherein the split and retain operation comprises identifying a new cluster including the received data point when the minimum centroid distance for the received data point is greater than the centroid threshold distance.

17. The method of claim 13, wherein the CAFB is incrementally and recursively updated.

18. The method of claim 13, wherein the initial data corresponds to a first application and the CAFB was previously updated based upon data corresponding to a second application different from the first application.

19. The method of claim 18, wherein the data corresponding to the first application has a same embedding dimension as the data corresponding to the second application.

20. The method of claim 18, wherein the data corresponding to the first application is amplitude normalized with respect to the data corresponding to the second application.

* * * * *